(12) United States Patent
Lee et al.

(10) Patent No.: US 9,153,489 B2
(45) Date of Patent: Oct. 6, 2015

(54) MICROELECTRONIC DEVICES HAVING CONDUCTIVE THROUGH VIA ELECTRODES INSULATED BY GAP REGIONS

(75) Inventors: Ho-Jin Lee, Seoul (KR); Byung Lyul Park, Seoul (KR); SeYoung Jeong, Suwon-si (KR); Hyunsoo Chung, Hwaseong-si (KR); Gilheyun Choi, Seoul (KR)

(73) Assignee: Samsung Electronics Co., Ltd. (KR)

( * ) Notice: Subject to any disclaimer, the term of this patent is extended or adjusted under 35 U.S.C. 154(b) by 217 days.

(21) Appl. No.: 13/474,992

(22) Filed: May 18, 2012

(65) Prior Publication Data

US 2012/0292782 A1    Nov. 22, 2012

(30) Foreign Application Priority Data

May 19, 2011 (KR) .................... 10-2011-0047450

(51) Int. Cl.
*H01L 23/48* (2006.01)
*H01L 23/52* (2006.01)
*H01L 29/40* (2006.01)
*H01L 21/768* (2006.01)

(52) U.S. Cl.
CPC ...... *H01L 21/76898* (2013.01); *H01L 21/7682* (2013.01); *H01L 23/481* (2013.01); *H01L 2224/02372* (2013.01); *H01L 2224/0401* (2013.01); *H01L 2224/05* (2013.01); *H01L 2224/05548* (2013.01); *H01L 2224/06181* (2013.01); *H01L 2224/13* (2013.01); *H01L 2224/13023* (2013.01); *H01L 2224/13024* (2013.01); *H01L 2224/13025* (2013.01)

(58) Field of Classification Search
USPC .......................... 257/774, 738, 786
See application file for complete search history.

(56) References Cited

U.S. PATENT DOCUMENTS

| | | | |
|---|---|---|---|
| 6,214,719 B1 * | 4/2001 | Nag | ............................. 438/619 |
| 7,030,005 B2 | 4/2006 | Lee | |
| 7,157,373 B2 | 1/2007 | Knorr et al. | |
| 7,572,673 B2 | 8/2009 | Chung et al. | |
| 7,795,139 B2 | 9/2010 | Han et al. | |

(Continued)

FOREIGN PATENT DOCUMENTS

| | | |
|---|---|---|
| JP | 2009-111367 | 5/2009 |
| JP | 2010-045162 | 2/2010 |

(Continued)

OTHER PUBLICATIONS

Sunohara, M. et al., Development of Silicon Module with TSVs and Global Wiring (L/S=0.8/0.8μm), *Electronic Components and Technology Conference*, 2009, p. 25-31.

*Primary Examiner* — Khiem D Nguyen
*Assistant Examiner* — Wilner Jean Baptiste
(74) *Attorney, Agent, or Firm* — Myers Bigel Sibley & Sajovec, PA

(57) ABSTRACT

A microelectronic device includes a substrate having a trench extending therethrough between an active surface thereof and an inactive surface thereof opposite the active surface, a conductive via electrode extending through the substrate between sidewalls of the trench, and an insulating layer extending along the inactive surface of the substrate outside the trench and extending at least partially into the trench. The insulating layer defines a gap region in the trench that separates the substrate and the via electrode. Related devices and methods of fabrication are also discussed.

20 Claims, 28 Drawing Sheets

(56) References Cited

U.S. PATENT DOCUMENTS

| | | | |
|---|---|---|---|
| 7,795,140 B2 | 9/2010 | Taguchi et al. | |
| 7,838,992 B2 | 11/2010 | Chung et al. | |
| 7,910,473 B2 | 3/2011 | Chen | |
| 2005/0221601 A1* | 10/2005 | Kawano | 438/622 |
| 2007/0048896 A1* | 3/2007 | Andry et al. | 438/106 |
| 2009/0261474 A1* | 10/2009 | Chung et al. | 257/738 |
| 2010/0038741 A1* | 2/2010 | Tanida et al. | 257/459 |
| 2010/0176494 A1 | 7/2010 | Chen | |
| 2011/0101435 A1* | 5/2011 | Jung et al. | 257/301 |
| 2011/0198757 A1* | 8/2011 | Su et al. | 257/764 |

FOREIGN PATENT DOCUMENTS

| | | |
|---|---|---|
| JP | 2010-166052 | 7/2010 |
| KR | 1020050102855 A | 7/2007 |
| KR | 1020070073184 A | 7/2007 |
| KR | 1020080111830 A | 12/2008 |
| KR | 1020090036521 A | 4/2009 |
| KR | 1020090054123 A | 7/2010 |
| KR | 1020100083718 A | 7/2010 |

* cited by examiner

MICROELECTRONIC DEVICES HAVING CONDUCTIVE THROUGH VIA ELECTRODES INSULATED BY GAP REGIONS

CROSS-REFERENCE TO RELATED APPLICATIONS

This U.S. non-provisional patent application claims priority under 35 U.S.C. §119 from Korean Patent Application No. 10-2011-0047450, filed on May 19, 2011, in the Korean Intellectual Property Office, the disclosure of which is hereby incorporated by reference herein in its entirety.

BACKGROUND

Embodiments of the inventive concepts relate generally to a semiconductor device. More particularly, embodiments of the inventive concepts relate to semiconductor devices having conductive through via electrodes and methods for fabricating the same.

There have been many advances in through-silicon-via (TSV) technology. In TSV technology, it is necessary to electrically isolate a semiconductor substrate from a through via electrode penetrating the semiconductor substrate. This electrical isolation can be accomplished by forming an oxide or other insulating layer around the through via electrode.

With increasing demand for high-speed semiconductor devices, the thickness of an insulating layer interposed between the through electrode and the semiconductor substrate has been increased. However, the increased thickness of the insulating layer may cause increased stress on the through via electrode and/or the semiconductor substrate. Moreover, as an aspect ratio of the through via electrode increases, a step coverage property of the insulating layer may be deteriorated. Accordingly, increasing the thickness of the insulating layer seems to hold little promise. In addition, with the downscaling of semiconductor devices, it can be difficult to provide the insulating layer with a sufficient thickness margin. This difficulty may increase as the through via electrode becomes smaller; for instance, for a cylindrical through via electrode with a small diameter, it can be hard to maintain the thickness margin of the insulating layer. The structure and/or operation of the semiconductor device may be deteriorated due to these difficulties.

SUMMARY

Embodiments of the inventive concepts provide semiconductor devices with improved isolating and electric properties and methods of fabricating the same.

According to some embodiments, a microelectronic device includes a substrate including a trench extending therethrough between an active surface thereof and an inactive surface thereof opposite the active surface, a conductive via electrode extending through the substrate between sidewalls of the trench and spaced apart therefrom, and an insulating layer extending along the inactive surface outside the trench and at least partially into the trench to define a gap region separating the via electrode from the substrate.

In some embodiments, the gap region may be an elongated void extending along sidewalls of the via electrode. The gap region is confined within the trench by the insulating layer.

In some embodiments, a liner layer may extend along the sidewalls of the via electrode between the via electrode and the insulating layer.

In some embodiments, the insulating layer may extend on upper portions of the sidewalls of the trench, while lower portions of the sidewalls of the trench may be free of the insulating layer. The insulating layer, the liner layer, and the sidewalls of the trench may define respective boundaries of the gap region.

In some embodiments, the insulating layer may extend along the sidewalls of the trench and the sidewalls of the via electrode, and the gap region may be a cavity confined within the insulating layer that surrounds the via electrode.

In some embodiments, the insulating layer may include a second insulating layer extending along the sidewalls of the trench and the sidewalls of the via electrode, and a first insulating layer extending along the inactive surface of the substrate outside the trench and extending at least partially into the trench to hermetically seal the gap region.

In some embodiments, the gap region may be a vacuum region or may be filled with a gaseous material. The gap region may have a dielectric constant of about 1.

In some embodiments, the device may include at least one microelectronic component on the active surface of the substrate, and one or more interlayer insulating layers on the active surface of the substrate including the at least one microelectronic component thereon.

In some embodiments, the gap region may extend beyond the active surface of the substrate and into at least one of the one or more interlayer insulating layers.

In some embodiments, the gap region may be confined between the active and inactive surfaces of the substrate.

In some embodiments, the device may further include a liner layer extending along the sidewalls of the trench between the substrate and the insulating layer.

In some embodiments, the sidewalls of the trench may be substantially concave.

In some embodiments, the gap region may separate the via electrode from the substrate by a distance equal to about twice a thickness of the insulating layer.

In some embodiments, the gap region may separate the via electrode from the substrate by a distance of about 4 micrometers or less. In further embodiments, the gap region may separate the via electrode from the substrate by a distance of about 500 nanometers or more. In still further embodiments, the gap region may separate the via electrode from the substrate by a distance between about 500 nanometers and about 4 micrometers.

According to further embodiments, a microelectronic device includes a substrate including a trench extending therethrough, a via electrode extending through the substrate between sidewalls of the trench and spaced apart therefrom, and an insulating layer extending at least partially into the trench on the sidewalls thereof and on sidewalls of the via electrode to define a gap region comprising an unobstructed space that separates the via electrode from the substrate.

In some embodiments, the gap region may be an elongated void extending along sidewalls of the via electrode, and the gap region may be confined within the trench by the insulating layer.

In some embodiments, the insulating layer may further extend along a surface of the substrate outside the trench.

In some embodiments, the surface may be an inactive surface of the substrate opposite an active surface of the substrate including at least one microelectronic component thereon. The device may further include one or more interlayer insulating layers on the active surface of the substrate.

In some embodiments, the device may further include at least one wiring layer on the active surface or the inactive surface and electrically connected to the via electrode. The gap region may be confined below the at least one wiring layer.

According to still further embodiments, a method of fabricating a microelectronic device includes forming a conductive via electrode extending through a substrate between an active surface thereof and an inactive surface thereof opposite the active surface, forming a trench extending into the inactive surface of the substrate such that the via electrode extends between sidewalls of the trench and is spaced apart therefrom, and then forming an insulating layer extending at least partially into the trench to define a gap region that separates the via electrode from the substrate.

In some embodiments, forming the insulating layer may include depositing the insulating layer on the inactive surface of the substrate outside the trench and extending at least partially into the trench.

In some embodiments, depositing the insulating layer may be performed at a deposition rate that is sufficient to form the insulation layer on the sidewalls of the trench and on sidewalls of the via electrode.

In some embodiments, depositing the insulating layer may define an overhang that seals the trench to confine the gap region within the insulating layer.

In some embodiments, the insulating layer may be a second insulating layer, and a first insulating layer may be deposited at a higher deposition rate than the second insulating layer. The first insulating layer may be deposited on the inactive surface of the substrate outside the trench and may extend at least partially into the trench to hermetically seal the gap region within the first and second insulating layers.

In some embodiments, depositing the insulating layer may be performed at a deposition rate such that the insulating layer extends partially into the trench to confine the gap region therein but does not completely cover the sidewalls thereof.

In some embodiments, a liner layer may be formed on sidewalls of the via electrode prior to depositing the insulating layer. The insulating layer may extend on upper portions of the sidewalls of the trench, while lower portions of the sidewalls of the trench may be free of the insulating layer. The insulating layer, the liner layer, and the sidewalls of the trench may define boundaries of the gap region.

In some embodiments, forming the trench includes thinning a surface of the substrate opposite the active surface thereof to define the inactive surface exposing a portion of the via electrode, and etching the inactive surface around the via electrode to define the trench therein surrounding the via electrode.

In some embodiments, at least one microelectronic component may be formed on the active surface of the substrate, and then one or more interlayer insulating layers may be formed on the active surface of the substrate.

In some embodiments, the via electrode may be formed after forming the at least one microelectronic component on the active surface.

In some embodiments, forming the trench may include isotropically etching the substrate around the via electrode to define the trench therein having curved sidewalls.

In some embodiments, isotropically etching may include iteratively isotropically etching the substrate around the via electrode to define the trench having a plurality of curved sidewalls.

In some embodiments, forming the via electrode may include forming a preliminary trench in the substrate, forming a sacrificial layer on sidewalls of the preliminary trench to define a via hole, and forming the via electrode in the via hole. Forming the trench may include thinning a surface of the substrate opposite the active surface thereof to define the inactive surface exposing a portion of the sacrificial layer, and selectively etching the sacrificial layer around the via electrode to define the trench.

In some embodiments, a liner layer may be formed on sidewalls of the sacrificial layer to define the via hole prior to forming the via electrode therein. The liner layer may have an etching selectivity to the sacrificial layer.

In some embodiments, a liner layer may be formed on the sidewalls of the preliminary trench prior to forming the sacrificial layer therein. The liner layer may have an etching selectivity to the sacrificial layer.

According to example embodiments of the inventive concepts, a semiconductor device may include a substrate including an active surface and an inactive surface opposite each other, a through electrode penetrating the substrate, a trench provided between the substrate and the through electrode, and a lower insulating layer covering the inactive surface of the substrate and extending into the trench. The lower insulating layer may be formed to define an air gap between the substrate and the through electrode in the trench.

In some embodiments, the lower insulating layer may include an external insulating layer covering the inactive surface of the substrate, and an internal insulating layer extending from the external insulating layer into the trench. The internal insulating layer may include a surface defining the air gap.

In other embodiments, the device may further include a liner layer interposed between the through electrode and the internal insulating layer to surround a sidewall of the through electrode.

In still other embodiments, the device may further include a liner layer interposed an inner surface of the substrate and the internal insulating layer to cover the inner surface of the substrate. The inner surface of the substrate may be spaced apart from the through electrode by the trench.

In even other embodiments, the device may further include an upper insulating layer covering the active surface of the substrate. The trench has first and second entrances facing the inactive and active surfaces, respectively, of the substrate, and the first entrance may be open and the second entrance may be sealed by the upper insulating layer.

In yet other embodiments, the device may further include an interlayer dielectric interposed between the substrate and the upper insulating layer. The through electrode may be formed to penetrate the interlayer dielectric beyond the substrate.

In further embodiments, the air gap may be formed between the inactive and active surfaces of the substrate in terms of vertical position to surround a sidewall of the through electrode.

In still further embodiments, the air gap may be formed between the inactive surface of the substrate and the upper insulating layer in terms of vertical position to surround a sidewall of the through electrode.

In even further embodiments, the lower insulating layer may include a first lower insulating layer and a second lower insulating layer, the first lower insulating layer may include an external insulating layer covering the inactive surface of the substrate and an internal insulating layer extending from the external insulating layer to seal the trench, and the second lower insulating may be interposed between the inactive surface of the substrate and the external insulating layer to cover the inactive surface of the substrate along with the external insulating layer and extends into the trench to define the air gap in conjunction with the internal insulating layer.

According to other example embodiments of the inventive concepts, a semiconductor device may include a substrate including a horizontal active surface, a horizontal inactive surface opposite the active surface, and an inner surface vertically connecting the active and inactive surfaces, a through electrode spaced apart from the inner surface to vertically penetrate the substrate, an air gap provided between the inner surface and the through electrode and disposed around the through electrode, and a lower insulating layer covering the inactive and inner surfaces and a sidewall of the through electrode, the lower insulating layer defining the air gap.

In some embodiments, the lower insulating layer may include an external insulating layer covering the inactive surface, and an internal insulating layer extending from the external insulating layer to cover the inner surface and the sidewall of the through electrode. The internal insulating layer may include a surface defining the air gap.

In other embodiments, the device may further include a liner layer covering the sidewall of the through electrode. The internal insulating layer and the liner layer may be interposed between the through electrode and the air gap, and the internal insulating layer may be interposed between the inner surface and the air gap.

In still other embodiments, the device may further include a liner layer covering the inner surface. The liner layer and the internal insulating layer may be interposed between the inner surface and the air gap, and the internal insulating layer may be interposed between the through electrode and the air gap.

In even other embodiments, the external insulating layer may be a double-layered structure, and the internal insulating layer may be a single-layered structure.

In yet other embodiments, a vertical section of the inner surface may be shaped like one of a linear shape, a concave shape, and a scallop shape formed by a plurality of concave shapes repeatedly arranged.

In further embodiments, the device may further include an integrated circuit disposed one the active surface, an interlayer dielectric provided on the active surface to cover the integrated circuit, and an upper insulating layer covering the interlayer dielectric.

In still further embodiments, the device may further include at least one of an upper wiring provided on at least one of the active surface, the interlayer dielectric, and the upper insulating layer to electrically connect the through electrode to the integrated circuit and a lower wiring provided on the lower insulating layer to electrically connect the through electrode to an external device.

In even further embodiments, the upper wiring may be provided on the interlayer dielectric, the through electrode penetrates the interlayer dielectric to be connected to the upper wiring, and the air gap may be provided between the inactive surface and the active surface or between the inactive surface and the upper wiring.

In yet further embodiments, the upper wiring may be provided on the upper insulating layer, the through electrode penetrates the interlayer dielectric and the upper wiring to be connected to the upper wiring, and the air gap may be provided between the inactive surface and the active surface or between the inactive surface and the upper wiring.

In yet further embodiments, the upper wiring may be provided on the active surface, the through electrode penetrates the substrate to be connected to the upper wiring, and the air gap may be provided between the inactive surface and the upper wiring.

According to still further example embodiments of the inventive concepts, a method of fabricating a semiconductor device may include providing a substrate including a top surface and a bottom surface opposite each other, forming a through electrode penetrating the top surface to be partially extending into the substrate, recessing the bottom surface to define an inactive surface of the substrate exposing a portion of the through electrode, forming a trench around the through electrode, the trench separating the through electrode from the substrate, forming a lower insulating layer covering the inactive surface, and forming an air gap, surrounded by the lower insulating layer, in the trench.

In some embodiments, the method may further include planarizing the substrate to remove the portion of the through electrode protruding from the inactive surface.

In other embodiments, the forming of the through electrode may include forming a hole in the substrate, the hole vertically penetrating the top surface and being spaced apart from the bottom surface, forming a liner layer covering an inner wall of the hole, and forming a conductive layer filling the hole provided with the liner layer.

In still other embodiments, the forming of the trench may include etching a portion of the substrate to form the trench around the through electrode. The trench may be formed to expose the liner layer around the through electrode and an inner surface of the substrate spaced apart from the liner layer and to have an entrance being open toward the inactive surface.

In even other embodiments, the forming of the through electrode may include forming a hole in the substrate, the hole vertically penetrating the top surface and being spaced apart from the bottom surface, forming an liner layer and a sacrificial layer on an inner wall of the hole, and forming a conductive layer filling the hole provided with the liner layer and the sacrificial layer.

In yet other embodiments, the forming of the trench may include recessing the bottom surface to expose the liner layer and the sacrificial layer, and selectively etching the sacrificial layer to form the trench around the through electrode.

In further embodiments, the forming of the liner layer and the sacrificial layer may include forming the sacrificial layer covering the inner wall of the hole and then forming the liner layer covering the sacrificial layer, and the forming of the trench may include etching the sacrificial layer interposed between the liner layer and the substrate. The trench may be formed to expose the liner layer around the through electrode and an inner surface of the substrate spaced apart from the liner layer and to have an entrance being open toward the inactive surface.

In still further embodiments, the forming of the liner layer and the sacrificial layer may include forming the liner layer covering the inner wall of the hole and then forming the sacrificial layer covering the liner layer, and the forming of the trench may include etching the sacrificial layer interposed between the through electrode and the liner layer. The trench may be formed to expose the liner layer covering an inner surface of the substrate and a sidewall of the through electrode spaced apart from the liner layer and to have an entrance being open toward the inactive surface.

In even further embodiments, the forming of the trench may further include etching a portion of the liner layer exposed by the inactive surface.

In yet further embodiments, the forming of the lower insulating layer may include forming an external insulating layer covering the inactive surface, and forming an internal insulating layer extending from the external insulating layer into the trench and sealing an entrance of the trench, the internal insulating layer including a surface surrounding the air gap.

In yet further embodiments, the forming of the lower insulating layer may include forming a first lower insulating layer including an external insulating layer covering the inactive surface of the substrate and an internal insulating layer extending from the external insulating layer to seal an entrance of the trench, and forming a second lower insulating layer disposed between the inactive surface of the substrate and the external insulating layer and in the trench, the second lower insulating layer covering the inactive surface of the substrate along with the external insulating layer and forming a surface surrounding the air gap in conjunction with the internal insulating layer. The forming of the second lower insulating layer may be followed by the forming of the first lower insulating layer.

In yet further embodiments, the method may further include at least one of forming an upper wiring connected to the through electrode on a top surface of the substrate and/or forming a lower wiring connected to the through electrode on the inactive surface of the substrate.

Other devices and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1A:
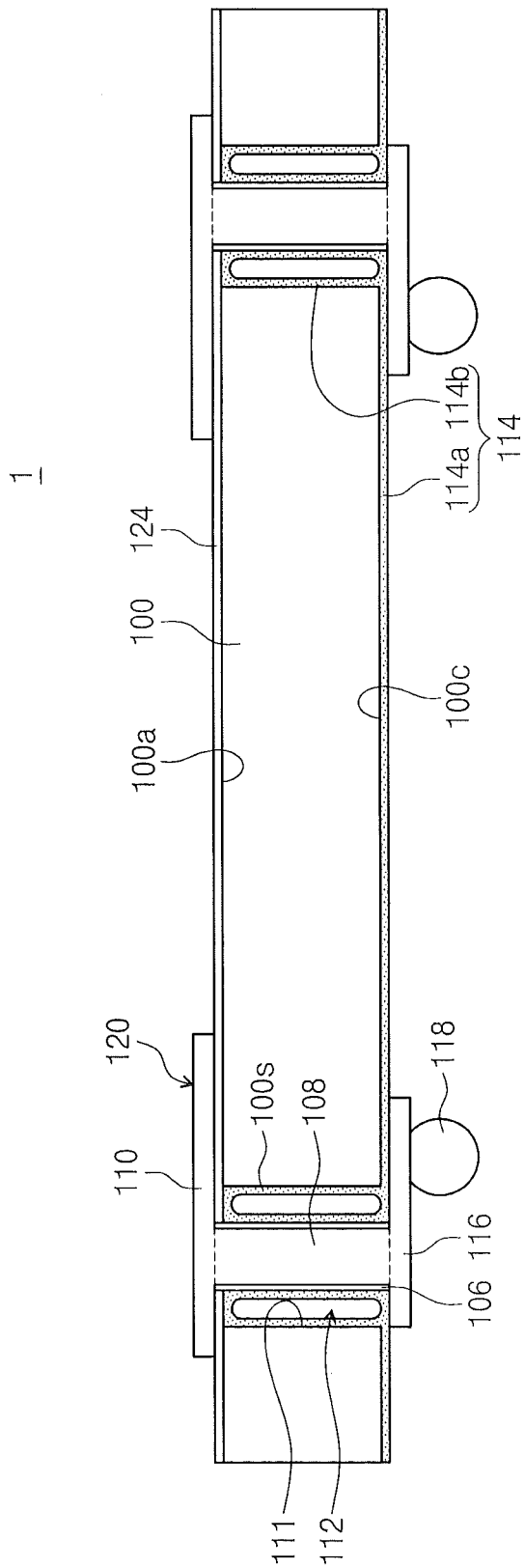
FIG. 1A is a cross-sectional view of a semiconductor device according to example embodiments of the inventive concepts.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is inverted, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1A is a cross-sectional view of a semiconductor device according to embodiments of the inventive concepts.

Referring to FIG. 1A, a semiconductor device 1 may include a conductive connecting portion 120 configured to vertically transmit an electric signal through a substrate 100. The conductive connecting portion 120 may include a conductive via electrode (also referred to herein as a through electrode) 108 vertically penetrating through the substrate 100. The conductive connecting portion 120 may further include at least one of an upper wiring 110 and a lower wiring 116. The upper wiring 110 may be disposed on a top or active surface 100a of the substrate 100 to be in contact with the through electrode 108, and the lower wiring 116 may be disposed on a bottom or inactive surface 100c of the substrate 100 to be in contact with the through electrode 108. The top surface 100a and the bottom surface 100c may be flat or substantially planar, and may extend in a direction substantially perpendicular to a thickness direction of the substrate 100.

The upper wiring 110 may extend horizontally or laterally along the top surface 100a of the substrate 100, and the lower wiring 116 may extend horizontally or laterally along the bottom surface 100c of the substrate 100. At least one of the upper wiring 110 and the lower wiring 116 may be configured to provide a redistribution structure. On the lower wiring 116, there may be a solder ball 118, as a connecting element, electrically connecting the semiconductor device 1 to another electronic device, such as another semiconductor device or a printed circuit board. Although not depicted, another connecting element may be disposed on the upper wiring 110.

The through electrode 108 may extend through the substrate 100 to be in contact with the upper wiring 110 and the lower wiring 116. Electrical signals transmitted from the upper wiring 110 and the lower wiring 116 may be delivered vertically to the lower wiring 116 and the upper wiring 110, respectively, through the substrate 100 by the through electrode 108.

The top and bottom surfaces 100a and 100c of the substrate 100 may be covered with a protection layer 124 and a lower insulating layer 114, respectively. The protection layer 124 and the lower insulating layer 114 may be configured to protect and electrically isolate the substrate 100 from an external environment. The conductive connecting portion 120 may be electrically isolated from the substrate 100. For instance, the protection layer 124 may be configured to separate and electrically isolate the upper wiring 110 from the top surface 100a of the substrate 100, and the lower insulating layer 114 may be configured to separate and electrically isolate the lower wiring 116 from the bottom surface 100c of the substrate 100. The through electrode 108 may be electrically isolated from an inner surface 100s of the substrate 100 by a gap region, also referred to herein as a gap region or gap 112. The gap region 112 may be a void or cavity or other unobstructed space bounded by the insulating layer 114, and may be filled with air and/or another gaseous material in some embodiments. The gap region 112 may be open in some embodiments, or may be fully enclosed by the insulating layer 114 in other embodiments. The inner surface 100s may be substantially perpendicular to the top surface 100a and to the bottom surface 100c.

The substrate 100 may be configured to define a trench 111 vertically extending along the through via electrode 108 and surrounding a sidewall of the through via electrode 108. In some embodiments, the lower insulating layer 114 may include an external insulating layer 114a covering the bottom surface 100c of the substrate 100 and an internal insulating layer 114b extending from the external insulating layer 114a into the trench 111. The internal insulating layer 114b may hermetically seal an entrance of the trench 111 and may be formed on an inner sidewall of the trench 111. As a result, the gap 112 may be formed in the trench 111. The gap 112 may be surrounded and confined by the internal insulating layer 114b formed on the inner sidewall of the trench 111. In some embodiments, the gap 112 may be vertically formed to extend along sidewalls of the through electrode 108. The gap 112 may be a vacuum-like region or may be filled with a gaseous material such as air. In this case, the dielectric constant of the gap 112 may be close to 1, an isolation property between the through electrode 108 and the substrate 100 can be improved compared with the case where a silicon oxide layer having a dielectric constant of 3.8 to 4.2 is disposed between the through electrode 108 and the substrate 100.

In some embodiments, an insulating liner layer 106 may be further disposed to surround the sidewall of the through electrode 108. The liner layer 106 may be formed of at least one of an oxide layer (e.g., $SiO_2$), a nitride layer (e.g., SiN), or a polymer layer. The liner layer 106 may extend from a bottom surface of the upper wiring 110 to a top surface of the lower wiring 116 along the sidewall of the through electrode 108 to surround the through electrode 108. In some embodiments, the through electrode 108 may be electrically isolated from the substrate 100 by the internal insulating layer 114b and the liner layer 106 as well as by the gap 112. In the case that the through electrode 108 includes a copper layer with high diffusivity, the liner layer 106 may be a nitride layer (e.g., SiN) and therefore, the liner layer 106 can serve as a barrier layer suppressing copper atoms in the through electrode 108 from being diffused.

When the through electrode 108 is formed of a different material from the substrate 100, the through electrode 108 may be deformed (e.g., expanded or distorted) due to a mismatch in coefficient of thermal expansion (CTE). However, according to example embodiments of the inventive concepts, it is possible to prevent the through electrode 108 from being in direct contact with the substrate 100 due to the liner layer 106, the internal insulating layer 114b and/or the gap 112 interposed therebetween. Furthermore, according to some aspects of the inventive concepts, the internal insulating layer 114b may serve as a stress buffer layer for the substrate 100; for instance, even when the through electrode 108 is expanded or distorted, the internal insulating layer 114b, not the substrate 100, may first undergo the consequent damage. That is, the liner layer 106, the internal insulating layer 114b and the gap 112 may be sized and configured to reduce or prevent stress on the through electrode 108 and/or the substrate 100. In the semiconductor device 1, the liner layer 106, the lower insulating layer 114, and/or the gap 112 may be modified in various ways in terms of shape or structure in accordance with some embodiments.

Between the substrate 100 and the protection layer 124, as will be described below, there may be one or more integrated circuits electrically connected to the conductive connecting portion 120, an interlayer dielectric covering the integrated circuits, a metal wiring electrically connected to the integrated circuits, and so forth. The through electrode 108 according to some embodiments may be classified into, for instance, three structures: a via last structure, a via middle structure, and a via first structure.

Figure 1B:
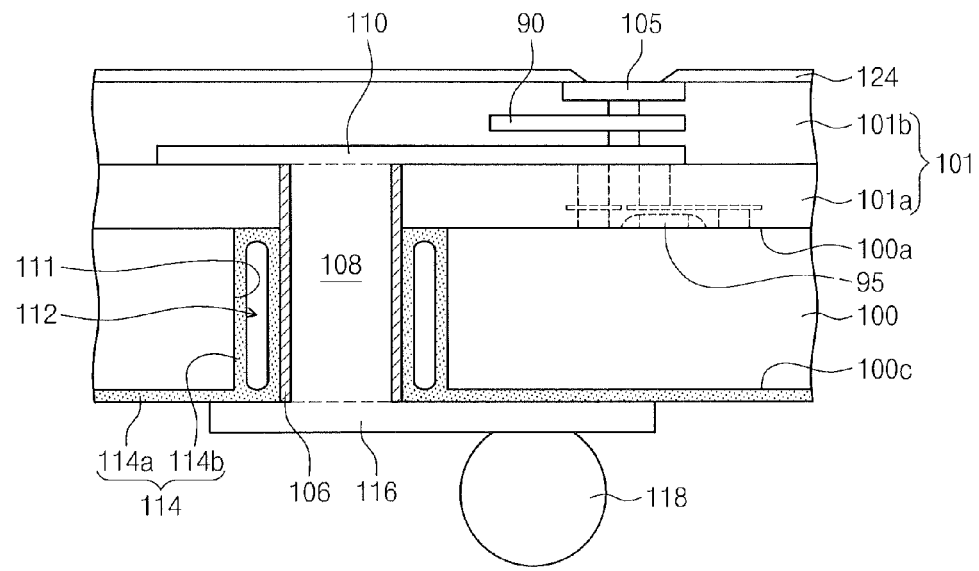
FIG. 1B is an enlarged cross-sectional view of a portion of FIG. 1A.
Figure 1C:
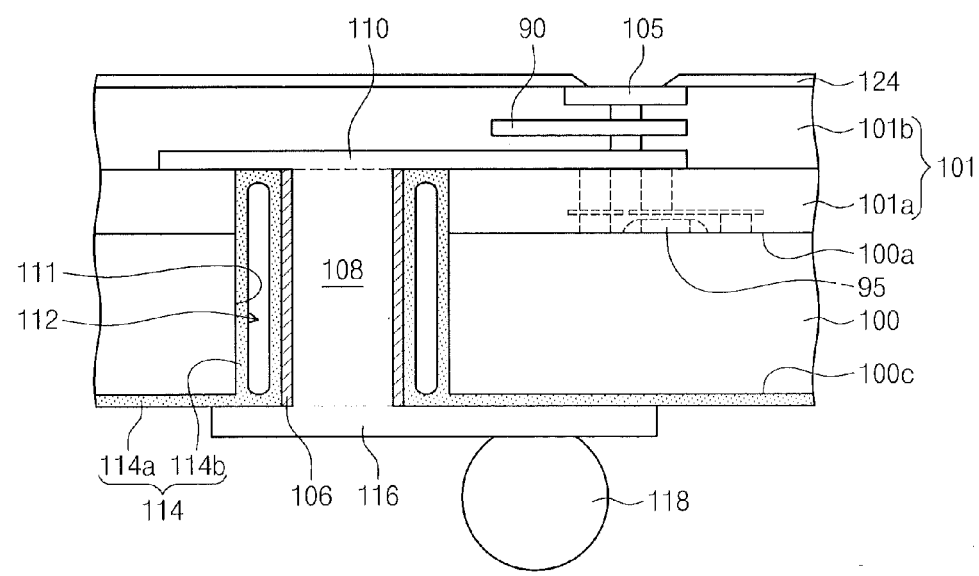
FIG. 1C is a cross-sectional view of a semiconductor device according to a modification of the embodiment described with reference to FIG. 1B.

FIG. 1B is an enlarged cross-sectional view of a portion of FIG. 1A. FIG. 1C is a cross-sectional view of a semiconductor device according to a modification of the embodiment described with reference to FIG. 1B.

Referring to FIG. 1B, the through electrode 108 may be configured to have a via middle structure. For instance, the through electrode 108 may be formed after forming a transistor or other integrated circuit 95 and before forming the upper wiring 110 and a metal wiring 90. There may be an interlayer dielectric 101 including a first interlayer dielectric 101a and a second interlayer dielectric 101b, which are sequentially stacked on the top or active surface 100a of the substrate 100. The first interlayer dielectric 101a may cover the integrated circuit 95, and the second interlayer dielectric 101 b may cover the upper wiring 110 and the metal wiring 90 on the first interlayer dielectric 101a, but may be confined below the second interlayer dielectric 101b. The through electrode 108 may penetrate the substrate 100 and the first interlayer dielectric 101a. The protection layer 124 may be formed on the second interlayer dielectric 101b to expose a bonding pad 105 connected to the metal wiring 90.

The trench 111 may penetrate or extend completely through the substrate 100, and thus, the gap 112 may be confined between the top surface 100a and the bottom surface 100c of the substrate 100. The upper wiring 110 may be electrically connected to the integrated circuit 95, and the through electrode 108 may be electrically connected to the integrated circuit 95. In the present embodiments, the upper wiring 110 and the metal wiring 90 may be referred to as a first metal wiring M1 and a second metal wiring M2, respectively.

In some embodiments, as shown in FIG. 1C, the trench 111 may be formed to penetrate not only the substrate 100 but also the first interlayer dielectric 101a. In this case, the gap 112 may extend beyond an interface between the first interlayer dielectric 101a and the substrate 100.

Figure 1D:
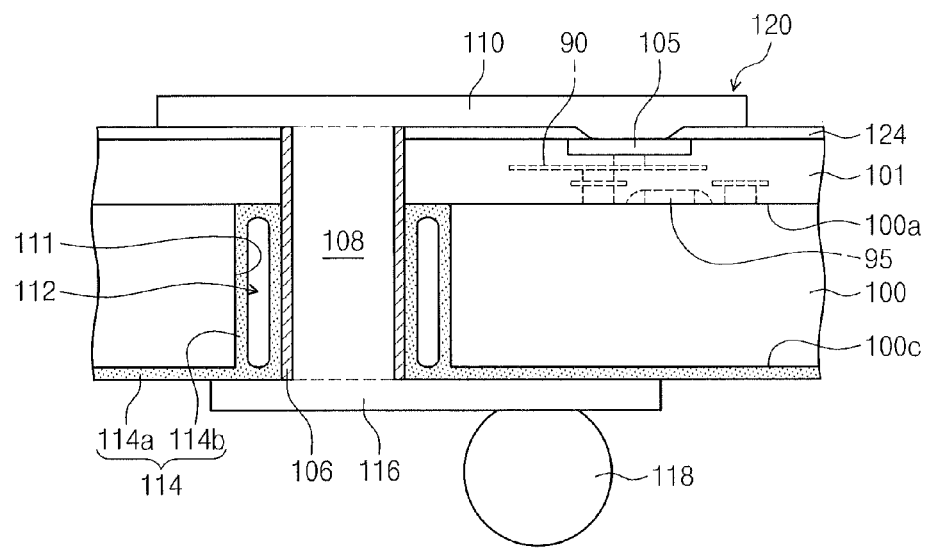
FIG. 1D is an enlarged cross-sectional view of a portion of FIG. 1A.
Figure 1E:
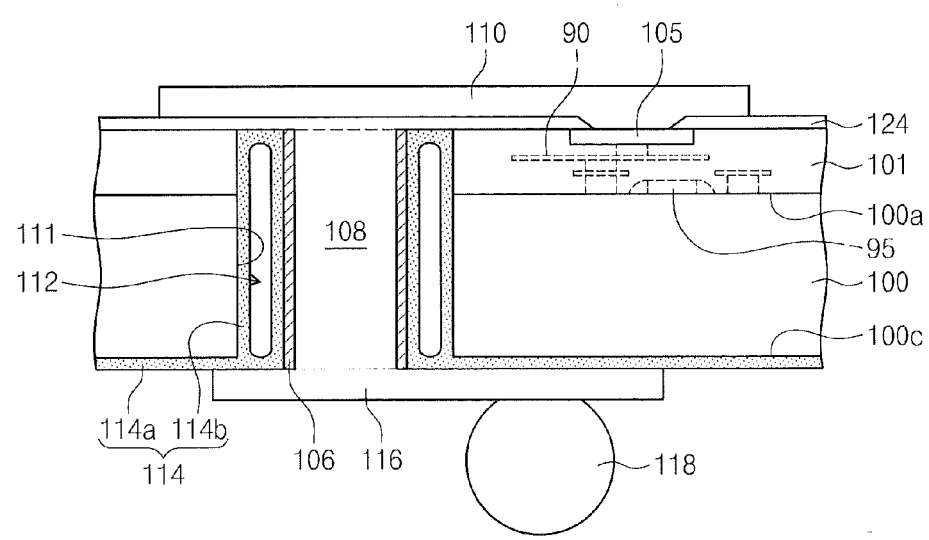
FIG. 1E is a cross-sectional view of a semiconductor device according to a modification of the embodiment described with reference to FIG. 1D.

FIG. 1D is an enlarged cross-sectional view of a portion of FIG. 1A. FIG. 1E is a cross-sectional view of a semiconductor device according to a modification of the embodiment described with reference to FIG. 1D.

Referring to FIG. 1D, the through electrode 108 may penetrate and extend completely through the interlayer dielectric 101, that covers the integrated circuit 95 and the metal wiring 90 on the top surface 100a of the substrate 100. In some embodiments, the through electrode 108 may be a via last structure that is formed after forming the integrated circuit 95 and the metal wiring 90. The protection layer 124 may be interposed between the upper wiring 110 and the interlayer dielectric 101, and the through electrode 108 may further extend to penetrate the protection layer 124.

The trench 111 may penetrate or extend through the substrate 100 but may not extend into the interlayer dielectric 101, and thus, the gap 112 may be confined between the top surface 100a and the bottom surface 100c of the substrate 100. The upper wiring 110 may be electrically connected to the integrated circuit 95 via the bonding pad 105. The upper wiring 110 may include a portion extending through the protection layer 124 to contact with the bonding pad 105. In the present embodiments, the metal wiring 90 and the upper wiring 110 may be called the first metal wiring M1 and the second metal wiring M2, respectively.

Referring to FIG. 1E, in some embodiments the trench 111 may be formed to penetrate not only the substrate 100 but also the interlayer dielectric 101. In this case, the gap 112 may extend beyond an interface between the interlayer dielectric 101 and the substrate 100, that is, beyond the active surface 100a and into the interlayer dielectric 101.

Figure 1F:
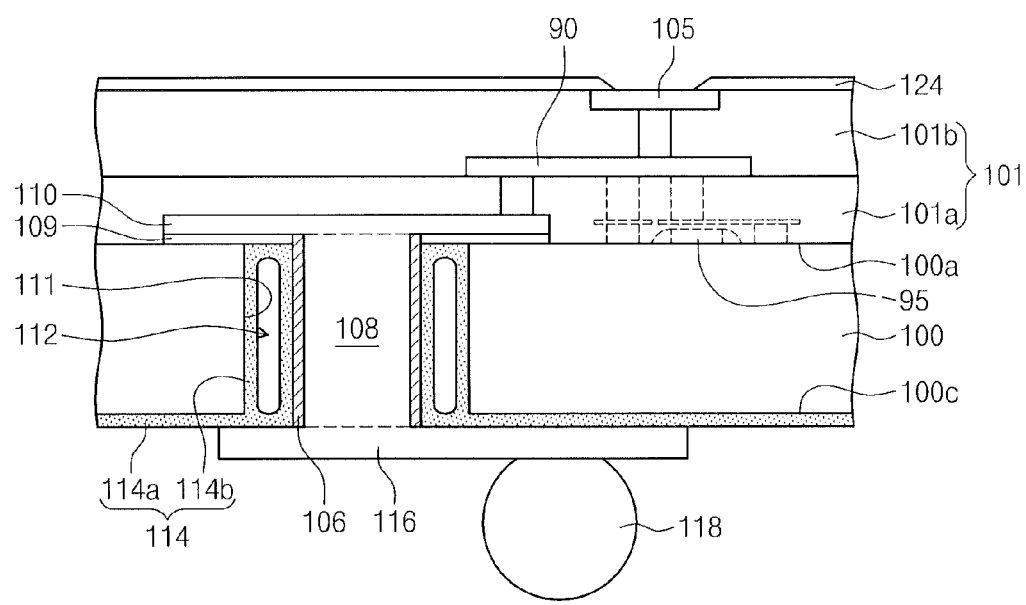
FIG. 1F is an enlarged cross-sectional view of a portion of FIG. 1A.

FIG. 1F is an enlarged cross-sectional view of a portion of FIG. 1A.

Referring to FIG. 1F, the through electrode 108 may be a via first structure that is formed before forming the integrated circuit 95, the upper wiring 110, and the metal wiring 90. The interlayer dielectric 101 may be formed on the top surface 100a of the substrate 100. In addition, the interlayer dielectric 101 may include the first interlayer dielectric 101a, which may cover the integrated circuit 95 and the upper wiring 110, and the second interlayer dielectric 101b, which may cover the metal wiring 90 and expose the bonding pad 105 on the first interlayer dielectric 101a. In the present embodiments, the upper wiring 110 may be called the first metal wiring M1, and the metal wiring 90 may be called the second metal wiring M2.

The trench 111 may penetrate or extend through the substrate 100, and thus, the gap 112 may be confined between the top surface 100a and the bottom surface 100c of the substrate 100. The upper wiring 110 may be electrically connected to the integrated circuit 95 via the metal wiring 90 or may be directly connected to the integrated circuit 95. In some embodiments, an insulating layer 109 may be formed on the top surface 100a of the substrate 100 to electrically isolate the upper wiring 110 from the substrate 100. In other embodiments, the liner layer 106 may extend laterally or horizontally on the top surface 100a of the substrate 100 between the upper wiring 110 and the top surface 100a of the substrate 100.

FIGS. 2A through 2J are cross-sectional views illustrating methods of fabricating a semiconductor device according to example embodiments of the inventive concepts.

Figure 2A:
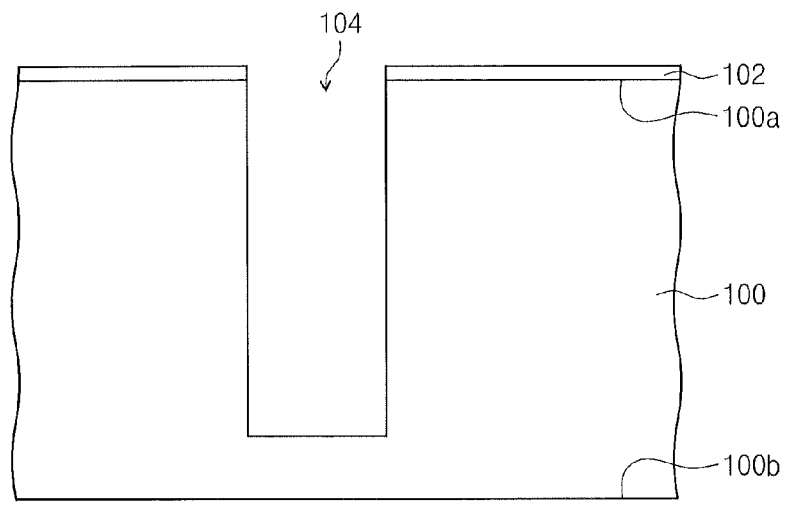
FIGS. 2A through 2J are cross-sectional views illustrating methods of fabricating a semiconductor device according to example embodiments of the inventive concepts.

Referring to FIG. 2A, the substrate 100 may be provided. The substrate 100 may include at least one semiconductor material, such as silicon or silicon-containing semiconductor. An upper insulating layer 102 may be formed on the top or active surface 100a of the substrate 100. A hole 104 may be formed to penetrate the upper insulating layer 102. The hole 104 may partially penetrate or extend into the substrate 100. For instance, a depth of the hole 104 may have a depth smaller than a distance between the top surface 100a and the bottom or inactive surface 100b of the substrate 100. In some embodiments, the hole 104 may be formed using an etching technique and/or a laser drilling technique. The top surface 100a and the bottom surface 100b of the substrate 100 may be substantially planar or flat surfaces of the substrate 100 that are opposite to each other.

Methods of fabricating a semiconductor device according to example embodiments of the inventive concepts may be applicable to realize a via last structure, a via middle structure, or a via first structure. For instance, in the case of the via middle structure shown in FIG. 1B or 1C, the upper insulating layer 102 may be the first interlayer dielectric 101a, and the integrated circuit 95 covered by the first interlayer dielectric 101a may be formed on the top surface 100a of the substrate 100. Alternatively, in the case of the via last structure shown in FIG. 1D or 1E, the upper insulating layer 102 may be the interlayer dielectric 101, and the integrated circuit 95 and the metal wiring 90, which are covered by the interlayer dielectric 101, may be formed on the top surface 100a of the substrate 100. As a further alternative, in the case of the via first structure shown in FIG. 1F, the upper insulating layer 102 may be the insulating layer 109, and the substrate 100 may be a bare wafer where the integrated circuits have not yet been formed.

Figure 2B:
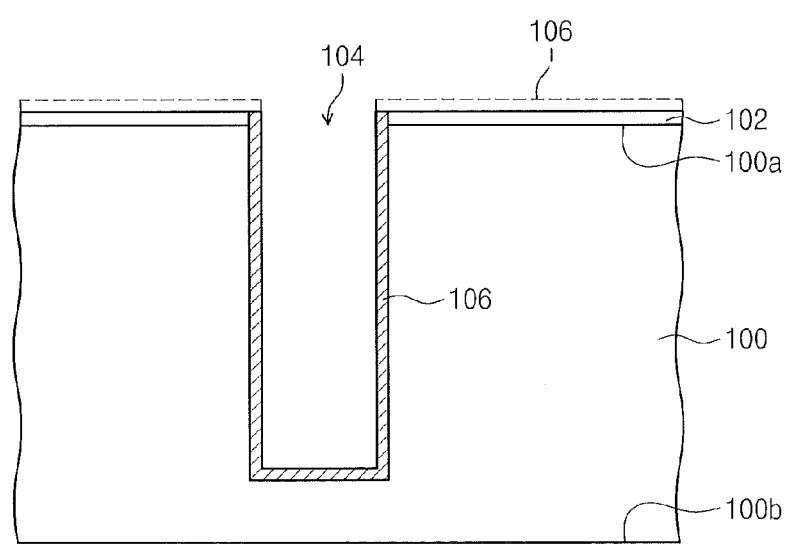

Referring to FIG. 2B, the liner layer 106 may be formed. The liner layer 106 may be an insulating material, such as an oxide layer (e.g., $SiO_x$), a nitride layer (e.g., SiNx), or a polymer layer, which may be formed using a deposition process. The liner layer 106 may be conformally deposited on an inner sidewall of the hole 104 to define a 'U'-shaped form in cross-section. The liner layer 106 may further extend on the upper insulating layer 102.

Figure 2C:
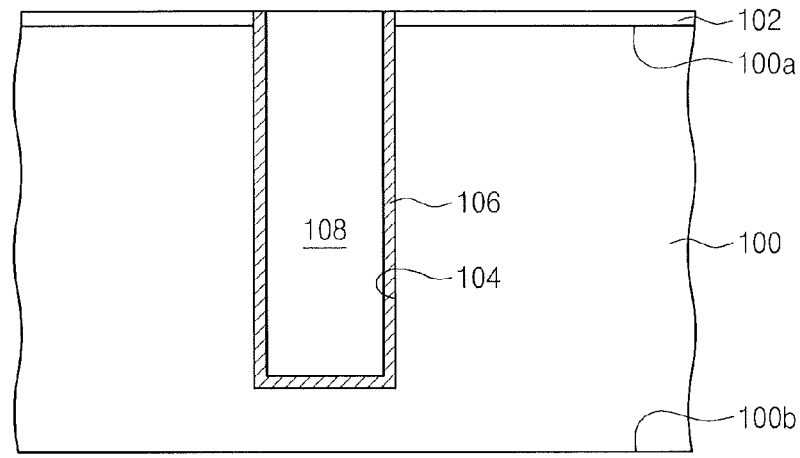

Referring to FIG. 2C, the through electrode 108 may be formed to fill the hole 104. The through electrode 108 may be formed of a conductive layer, such as polysilicon, metal or any combination thereof, using a deposition process, an epitaxial growth process, and/or a plating process. For instance, the formation of through electrode 108 may include depositing a metal layer, such as copper or tungsten metal, or a polysilicon layer, on the substrate 100 to a thickness, and then planarizing the deposited metal or polysilicon layer to expose the upper insulating layer 102. In the case that the through electrode 108 includes a copper layer, a barrier layer configured to suppress diffusion of copper atoms may also be formed on sidewalls of the hole 104. In some embodiments, in the case where the liner layer 106 may be formed of a nitride layer (e.g., SiN or $Si_3N_4$), the liner layer 106 may serve as the barrier layer, and therefore, no additional barrier layer may be needed.

Figure 2D:
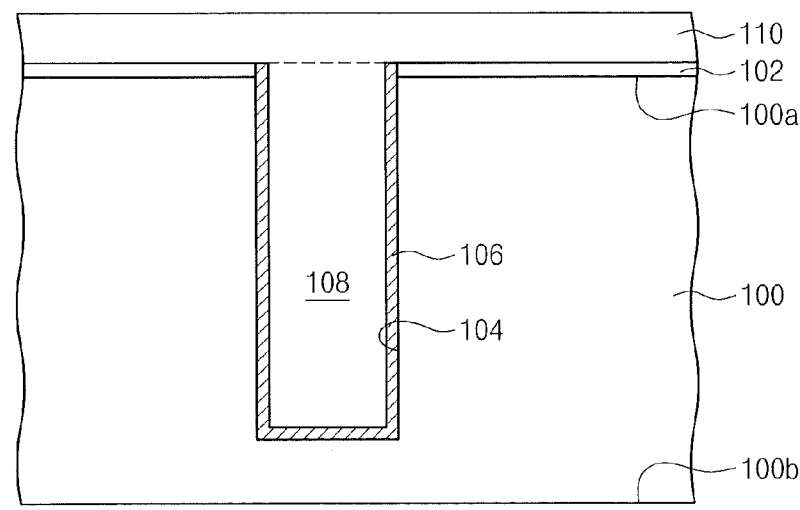

Referring to FIG. 2D, the upper wiring 110 connected to the through electrode 108 may be optionally selectively formed on the top surface 100a of the substrate 100. In some embodiments, the upper wiring 110 may include a metal layer, which may be formed using a deposition process or a plating process. In other embodiments, the through electrode 108 and the upper wiring 110 may be formed using the same process. For instance, the formation of the through electrode 108 and the upper wiring 110 may include depositing a metal layer on the substrate 100 to a thickness sufficient to fill the hole 104, and then patterning the metal layer to form the through electrode 108 and the upper wiring 110. In still other embodiments, the formation of the upper wiring 110 may be skipped or otherwise not performed.

Figure 2E:
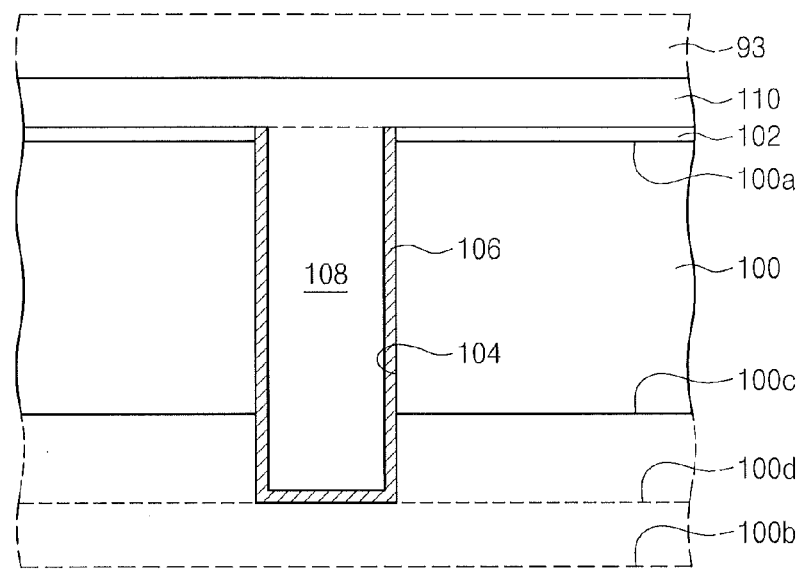

Referring to FIG. 2E, the bottom surface 100b of the substrate 100 may be recessed or thinned to expose the through electrode 108, also referred to herein as a recess process or backside thinning process. The recess process may be performed using an etchant capable of selectively etching the substrate 100 of, for instance, silicon, to expose the through electrode 106. As the result of the recess process, the substrate 100 may have a bottom surface 100c exposing a bottom surface of the through electrode 108 and/or the liner layer 106. In some embodiments, the recess process may include grinding the bottom surface 100b of the substrate 100 to form a surface 100d and etching the surface 100d to expose the through electrode 108. The formation of the surface 100d may be performed in such a way that the through electrode 108 is not exposed. In other embodiments, the recess process may be performed using a chemical mechanical polishing (CMP) process. In still other embodiments, the recess process may include removing a lower portion of the substrate 100 using a grinding or CMP process to form the surface 100d, and then etching the surface 100d using a spin etching process. The spin etching process may include rotating the substrate 100 and supplying an etchant onto the rotating substrate 100. The spin etching process may be performed in a dry or wet etching manner. For instance, the spin etching process may include supplying a mixed solution of hydrofluoric acid and nitric acid or a vaporized substance of the mixed solution onto the surface 100d of the substrate 100. Alternatively, the spin etching process may include may include supplying a mixture gas of hydrogen bromide (HBr) and chlorine ($Cl_2$), a mixture gas of sulfur hexafluoride ($SF_6$) and chlorine ($Cl_2$), or a mixture gas of hydrogen bromide (HBr), chlorine ($Cl_2$) and sulphur hexafluoride ($SF_6$) onto the surface 100d of the substrate 100. In certain embodiments, the grinding or CMP process and the spin etching process may be performed in an in-situ manner, and in this case, it may be possible to effectively reduce a process time for the process of exposing the through electrode 108. In certain embodiments, during the process of exposing the through electrode 108, a supporting element 93, which may be a tape or a glass substrate, may be further formed on the substrate 100 to support the substrate 100 and reduce or prevent damage to the top surface 100a. Hereinafter, the top surface 100a of the substrate 100 may be an active surface, and the bottom surface 100c of the substrate 100 may be an inactive surface. The bottom surface 100c may be a substantially planar or flat surface of the substrate 100. In the present specification, the top surface 100a may be referred to as "active surface" and the bottom surface 100c may be referred to as "inactive surface".

Figure 2F:
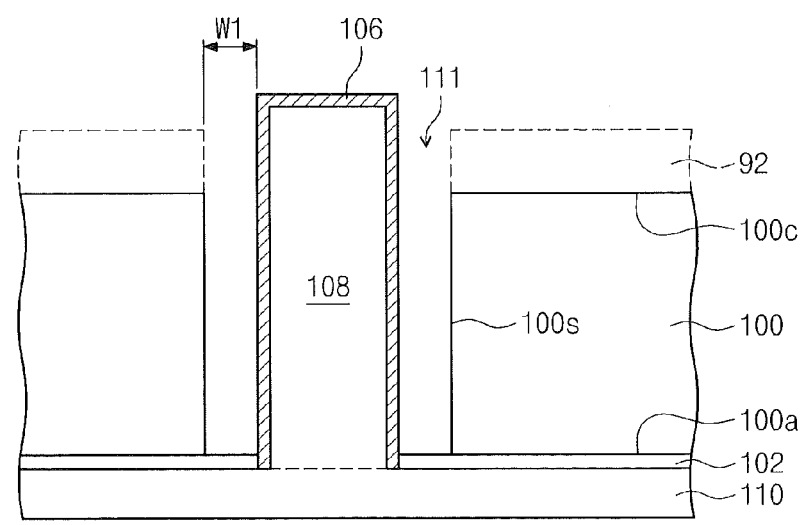

Referring to FIG. 2F, a mask 92 may be formed on the inactive surface 100c of the substrate 100. For instance, the formation of the mask 92 may include inverting or rotating the substrate 100, such that the active surface 100a is located below the inactive surface 100c, and then, coating and patterning a photoresist layer to form the mask 92 surrounding the through electrode 108 and being spaced apart from the sidewall of the through electrode 108. An etching process using the mask 92 as an etch mask may be performed to partially remove a portion of the substrate 100 for formation of the trench 111 around the through electrode 108. The trench 111 may be formed to have one end thereof defined by the upper insulating layer 102 and the other end being open. The mask 92 may be removed by an ashing process.

In some embodiments, the trench 111 may be formed using an anisotropic dry etching process, and in this case, the trench 111 may extend along sidewalls of the through electrode 108 to surround the through electrode 108. The trench 111 may expose the inner surface 100s of the substrate 100 and the liner layer 106 surrounding the through electrode 108. A distance between the inner surface 100s of the substrate 100 and the liner layer 106 (i.e., a width W1 of the trench 111), which is measured along the sidewalls of the through electrode 108, may be substantially constant. The width W1 may be greater than about twice the thickness of the insulating layer 114 that is deposited in a subsequent step. In other embodiments, the width W1 of the trench 111 may gradually increase or decrease along the sidewalls of the through electrode 108. The inner surface 100s may be a vertical or slanted surface connecting the active surface 100a and the inactive surface 100c.

Figure 2G:
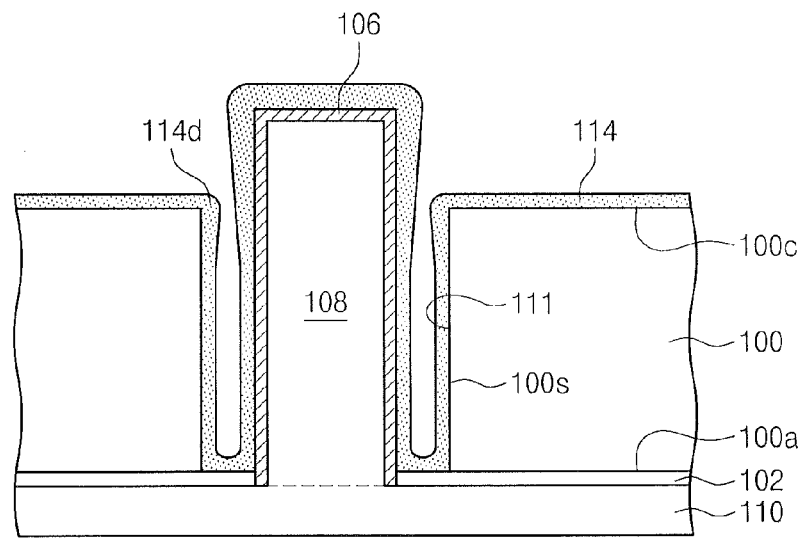

Referring to FIG. 2G, an oxide layer, a nitride layer or a polymer layer may be deposited using a deposition process (e.g., CVD process) to form the lower insulating layer 114. The lower insulating layer 114 may extend from the inactive surface 100c of the substrate 100 outside the trench 111 into an inner space of the trench 111 according to a step coverage property or a process condition of the deposition process. In other words, the lower insulating layer 114 may be formed at a deposition rate that is sufficient to form the insulating layer 114 on sidewalls of the trench 111 and on the sidewalls of the through electrode 108. For instance, the lower insulating layer 114 may be intentionally formed to have an overhang portion 114d hermetically sealing an entrance of the trench 111, while other portion of the lower insulating layer 114 may cover an inner surface of the trench 111.

Figure 2H:
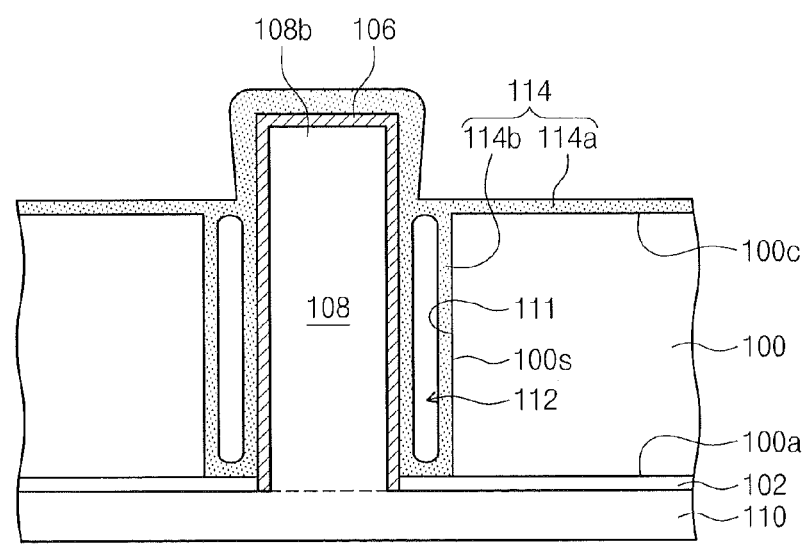

Referring to FIG. 2H, the trench 111 may be sealed by the lower insulating layer 114, and thus the gap 112 may be formed in the trench 111 and confined within the lower insulating layer 114. The lower insulating layer 114 may include an external insulating layer 114a covering the inactive surface 100c of the substrate 100 and an internal insulating layer 114b extending into the trench 111. In some embodiments, the lower insulating layer 114 may be formed to veil or cover a protruding portion 108b of the through electrode 108 which protrudes from the inactive surface 100c. The gap 112 confined by the internal insulating layer 114b may define an elongated void in the trench 111. The gap 112 may be substantially filled with an air, and therefore, it may have a dielectric constant that is close to 1. Alternatively, the gap 112 may be in a vacuum state and have a dielectric constant of about 1. The through electrode 108 and the inner surface 100s of the substrate 100 may be spaced apart and electrically insulated from each other by the liner layer 106, the gap 112 having a very low dielectric constant (e.g., of about 1), and the internal insulating layer 114b. The gap 112 may separate the through electrode 108 from the inner surface 100s of the substrate 100 by a distance of about 500 nanometers or more in some embodiments, or by a distance of about 4 micrometers or less in some embodiments, or by a distance between about 500 nanometers to about 4 micrometers.

Figure 2I:
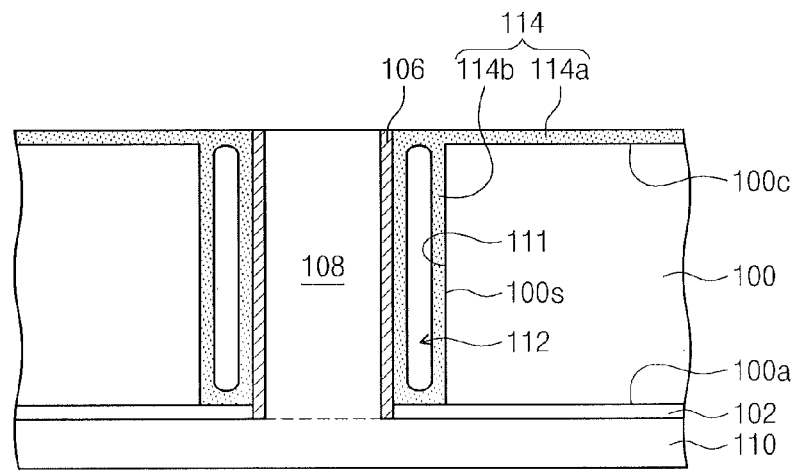

Referring to FIG. 2I, a planarization process may be performed to remove the protruding portion 108b of the through electrode 108. The planarization process may be performed using a CMP process, a grinding process, a dry etching process, or any combination thereof. The planarization process may be performed such that the external insulating layer 114a remains on the inactive surface 100c. During the planarization process, portions of the liner layer 106 and the lower insulating layer 114 covering the protruding portion 108b may be removed along with the protruding portion 108b.

Figure 2J:
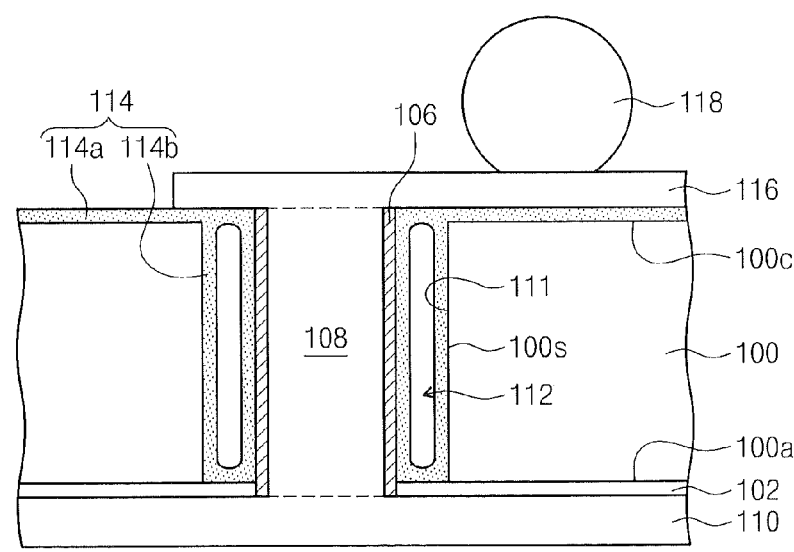

Referring to FIG. 2J, the lower wiring 116 connected to the through electrode 108 may be selectively or locally formed on the inactive surface 100c of the substrate 100. As a result, the fabrication of the semiconductor device 1 shown in FIG. 1A may be accomplished. In some embodiments, the lower wiring 116 may be configured to have a redistribution structure. Furthermore, the solder ball 118, as a connecting element, may be additionally attached to the lower wiring 116. In other embodiments, the solder ball 118 may be directly attached to the through electrode 108 without the lower wiring 116. In still other embodiments, another solder ball may be attached on the upper wiring 110. In even other embodiments, another solder ball may be directly attached to the through electrode 108 without the upper wiring 110.

FIGS. 2K through 2N are cross-sectional views illustrating methods of fabricating a semiconductor device according to a modification of the embodiment described with reference to FIG. 2J. The modified embodiments, which will be described with reference to FIGS. 2K through 2N, may be applied to one or more embodiments described in the present specification.

Figure 2K:
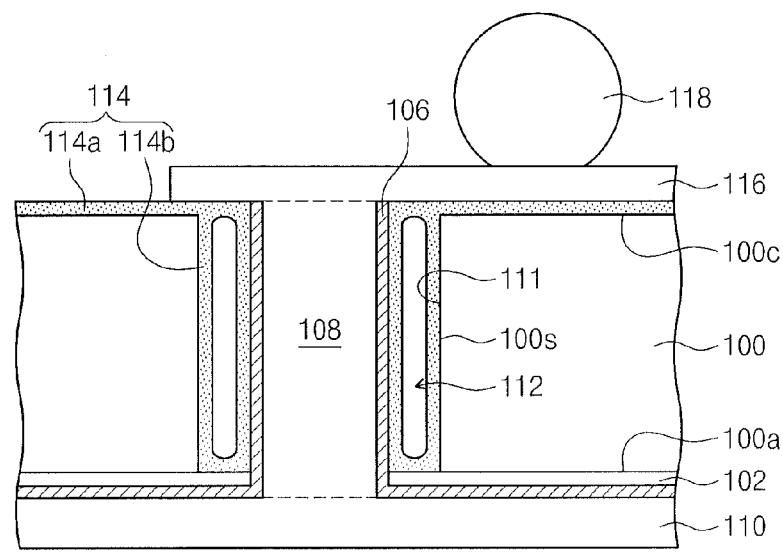
FIGS. 2K through 2N are cross-sectional views illustrating methods of fabricating a semiconductor device according to a modification of the embodiment described with reference to FIG. 2J.

Referring to FIG. 2K, as similarly described with reference to FIG. 2B, the liner layer 106 may be formed to cover the upper insulating layer 102. Accordingly, the liner layer 106 may extend from the sidewall of the through electrode 108 and along the active surface 100a of the substrate 100 outside the trench 111.

Figure 2L:
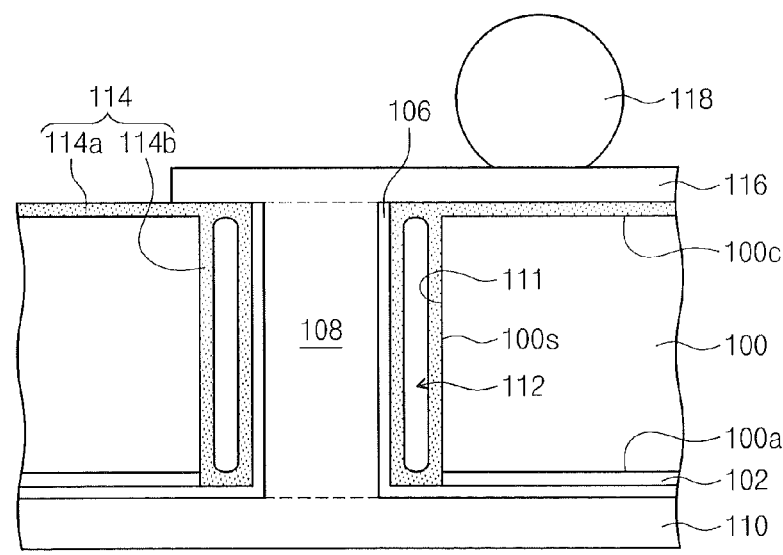

Referring to FIG. 2L, the trench 111 may be formed to penetrate the upper insulating layer 102 as well as the substrate 100, and thus, the gap 112 may be vertically extended beyond the active surface 100a. Meanwhile, during the formation of the extended trench 111, the liner layer 106 may be etched along with the upper insulating layer 102, which may result in an etching damage to the sidewall of the through electrode 108. To overcome this technical difficulty, the upper insulating layer 102 and the liner layer 106 may be formed of materials having an etch selectivity with respect to each other.

Figure 2M:
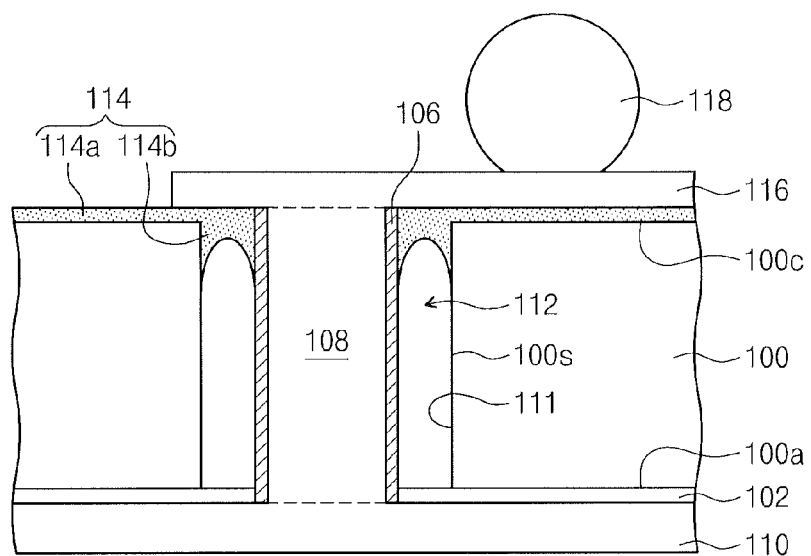

Referring to FIG. 2M, the formation of the lower insulating layer 114 may include depositing an insulating layer on the inactive surface 100c with a relatively high deposition rate. In this case, an overhang hermetically sealing the entrance of the trench 111 may be formed at an initial stage of the formation of the insulating layer, and thus, the lower insulating layer 114 may be partially formed in the trench 111 and the inner wall of the trench 111 and/or the liner layer 106 may be partially exposed by the gap 112. In other words, the lower insulating layer 114 may be deposited at a rate such that the layer 114 extends partially into the trench 111 to confine the gap 112 therein, but does not completely cover the sidewalls of the trench 111. The lower insulating layer 114 may be formed to include the internal insulating layer portion 114b sealing the entrance of the trench 111 and the external insulating layer portion 114a covering the inactive surface 100c. The trench 111 may be sealed by the internal insulating layer 114b to define the gap 112 therein. The through electrode 108 may be spaced apart and electrically insulated from the inner surface 100s of the substrate 100 by the liner layer 106 and the gap 112. The liner layer 106 may prevent the inner surface 100s of the substrate 100 from being in direct contact with the through electrode 108.

Figure 2N:
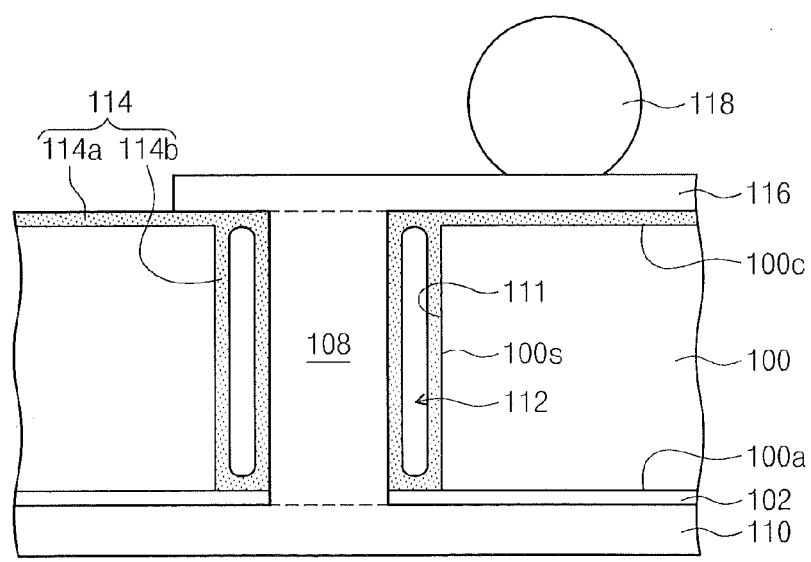

Referring to FIG. 2N, the formation of the liner layer 106 may be skipped in some embodiments. The internal insulating layer 114b may cover and extend along the sidewalls of the through electrode 108 to serve as the liner layer.

Figure 3A:
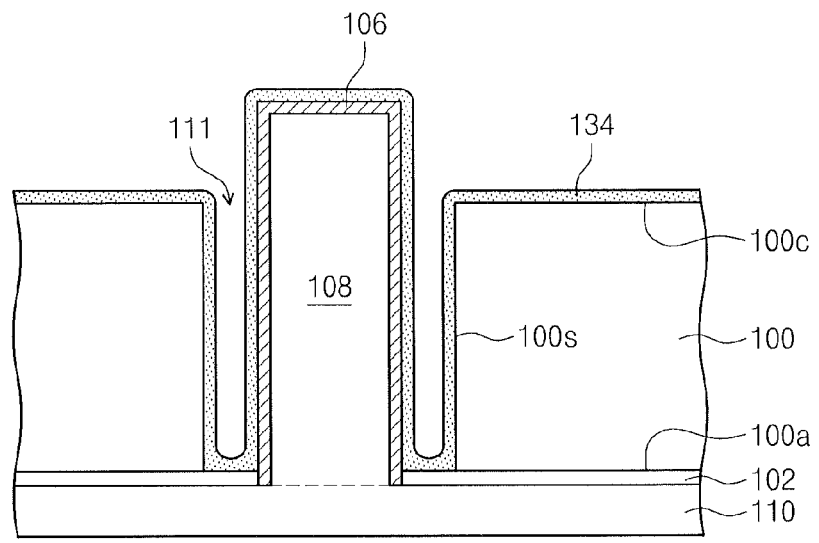
FIGS. 3A through 3C are cross-sectional views illustrating methods of fabricating a semiconductor device according to other example embodiments of the inventive concepts.
Figure 3B:
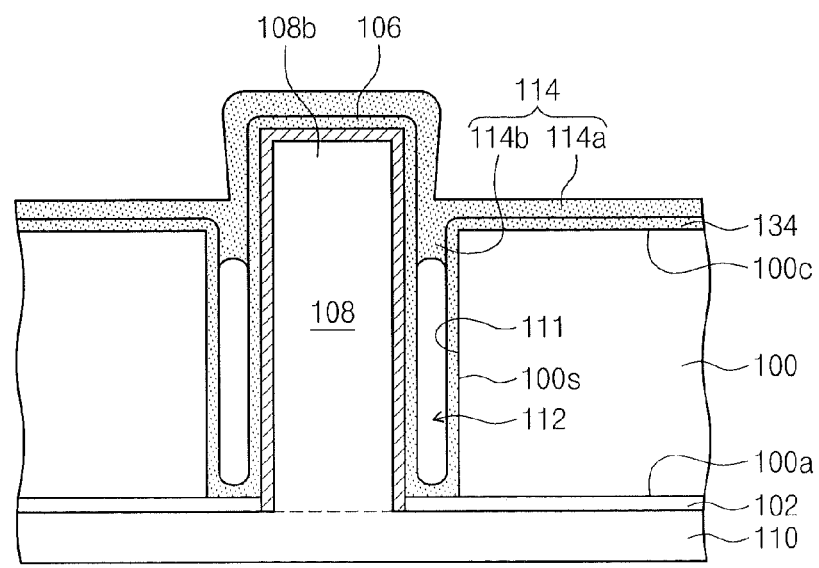
Figure 3C:
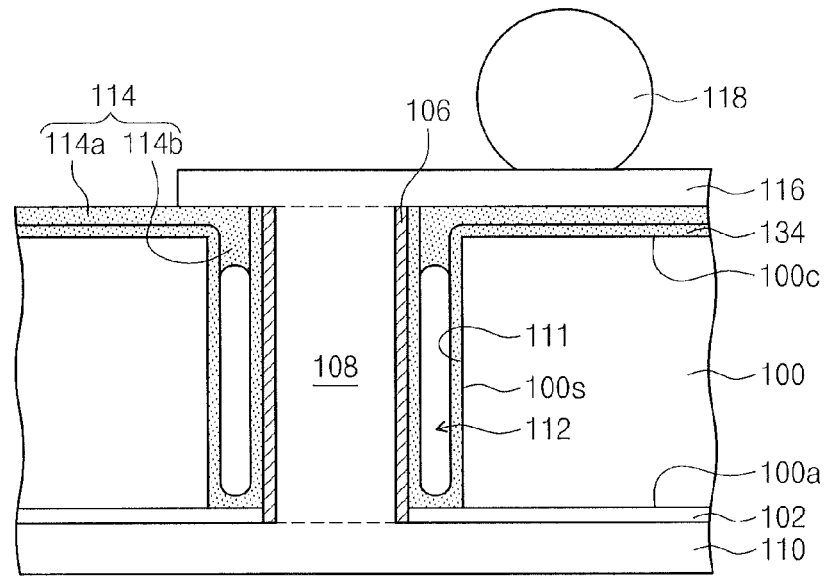
Figure 3D:
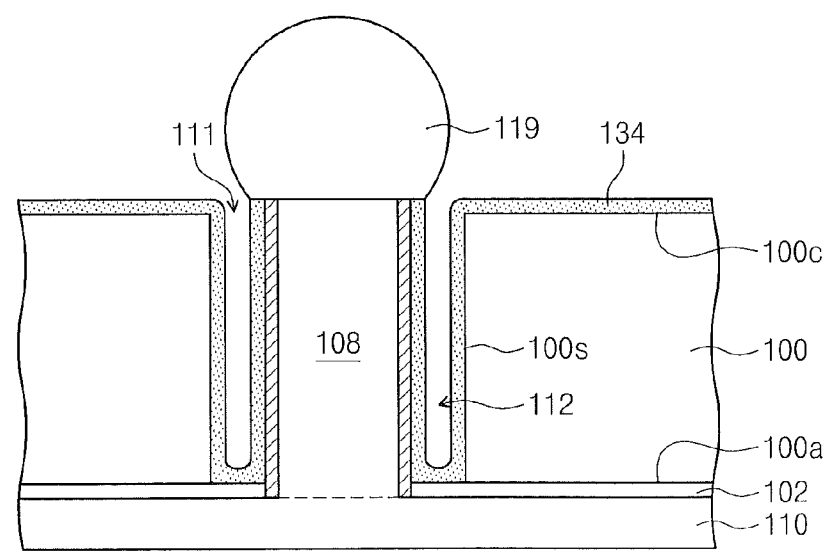
FIG. 3D is a cross-sectional view illustrating methods of fabricating a semiconductor device according to a modification of the embodiment described with reference to FIG. 3C.

FIGS. 3A through 3C are cross-sectional views illustrating methods of fabricating a semiconductor device according to other example embodiments of the inventive concepts. FIG. 3D is a cross-sectional view illustrating methods of fabricating a semiconductor device according to a modification of the embodiment described with reference to FIG. 3C.

Referring to FIG. 3A, the substrate 100 may be selectively etched using the process described with reference to FIGS. 2A through 2F or modifications thereof to form the trench 111 around the through electrode 108. A second lower insulating layer 134 may be formed before the formation of the first lower insulating layer 114, which will be described with reference to FIG. 3B. The second lower insulating layer 134 may be conformally formed on the inactive surface 100c of the substrate 100 to have a curved shape. For instance, the second lower insulating layer 134 may conformally cover sidewalls of the substrate 100 and the liner layer 106 in the trench 111. In other words, the second lower insulating layer 134 may be formed to extend along or cover the inactive surface 100c of the substrate 100 and surround the through electrode 108. In some embodiments, the second lower insulating layer 134 may be formed by depositing an insulating material (e.g., oxide, nitride, or polymer) with a relatively low deposition rate, where the deposition rate may be selected in such a way that the entrance of the trench 111 may not be sealed by the second lower insulating layer 134.

Referring to FIG. 3B, the first lower insulating layer 114 may be formed on the second lower insulating layer 134. In some embodiments, the formation of the first lower insulating layer 114 may include depositing an insulating layer on the second lower insulating layer 134 with a relatively high deposition rate. In this case, an overhang hermetically sealing the entrance of the trench 111 may be formed at an initial stage of the formation of the lower insulating layer 114. The first lower insulating layer 114 may be formed to include the external insulating layer portion 114a on or covering the second lower insulating layer 134 on the inactive surface 100c and the internal insulating layer portion 114b sealing the entrance of the trench 111. The internal insulating layer 114b may extend into but may not completely fill the trench 111. In some embodiments, the second lower insulating layer 134 and the internal insulating layer portion 114b may be formed to define the gap 112. The external insulating layer portion 114a and the second lower insulating layer 134 may be sequentially stacked on the inactive surface 100c of the substrate 100 to form a double-layered structure, while the second lower insulating layer 134 may be solely disposed on the lower sidewalls of the trench 111 to form a single-layered structure.

Referring to FIG. 3C, a planarization process may be performed to remove the protruding portion 108b of the through electrode 108. Furthermore, the lower wiring 116 may be additionally formed to be connected to the through electrode 108. The planarization process may be performed to remove portions of the first lower insulating layer 114, the second lower insulating layer 134, and the liner layer 106 that cover the protruding portion 108b of the through electrode 108. The gap 112 may be confined within portions of the insulating layers 114 and 134 between the through electrode 108 and the inner surface 100s of the substrate 100, and the through electrode 108 may be electrically isolated from the substrate 100. Meanwhile, according to the aforementioned embodiments, the liner layer 106 and the second lower insulating layer 134 may define a double-layered structure on the sidewall of the through electrode 108, and the second lower insulating layer 134 may be formed on the sidewalls of the trench 111 defined by the inner surface 100s of the substrate 100. Accordingly, it is possible to prevent the inner surface 100s of the substrate 100 from being in contact with the through electrode 108. In the case where the through electrode 108 is formed of a material containing copper, at least one of the liner layer 106 and the second lower insulating layer 134 may include a nitride layer to serve as a copper diffusion barrier layer.

In some embodiments, as shown in FIG. 3D, during the planarization process, the removal of the protruding portion 108b of the through electrode 108 may be performed after forming the second lower insulating layer 134, and without the formation of the lower insulating layer 114 such that the gap 112 is defined between the sidewalls of the through electrode 108 and the sidewalls of the trench 111 in the substrate 100, but is not hermetically sealed. The width of the trench 111 (e.g., the distance between the sidewalls 100s of the substrate 100 and the sidewall of the through electrode 108) is greater than twice the thickness of the lower insulating layer 134 in these embodiments. A solder ball 119 may be attached on the through electrode 108. Thus some embodiments, a gap having an open-ended shape may be formed in the trench 111 or between the through electrode 108 and the inner surface 100s of the substrate 100.

Figure 4A:
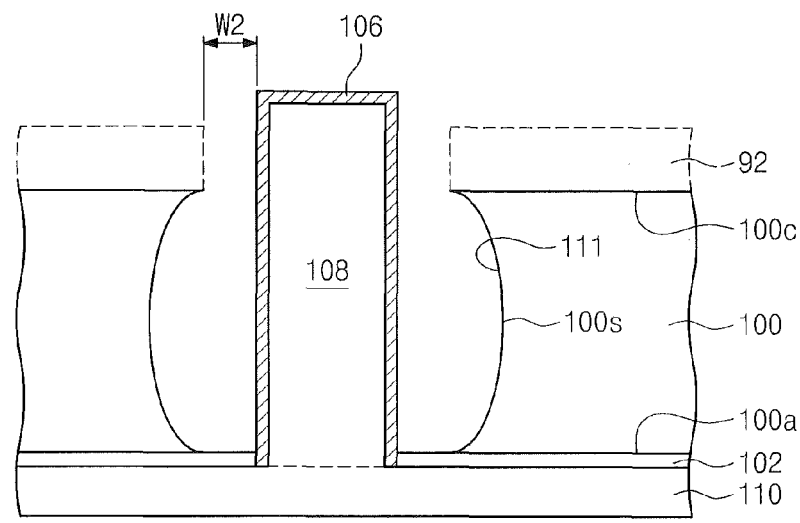
FIGS. 4A through 4C are cross-sectional views illustrating methods of fabricating a semiconductor device according to still other example embodiments of the inventive concepts.
Figure 4B:
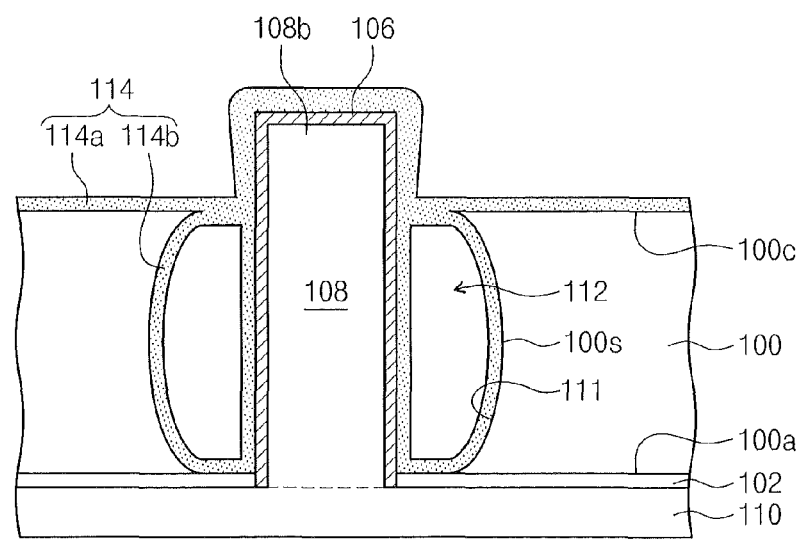
Figure 4C:
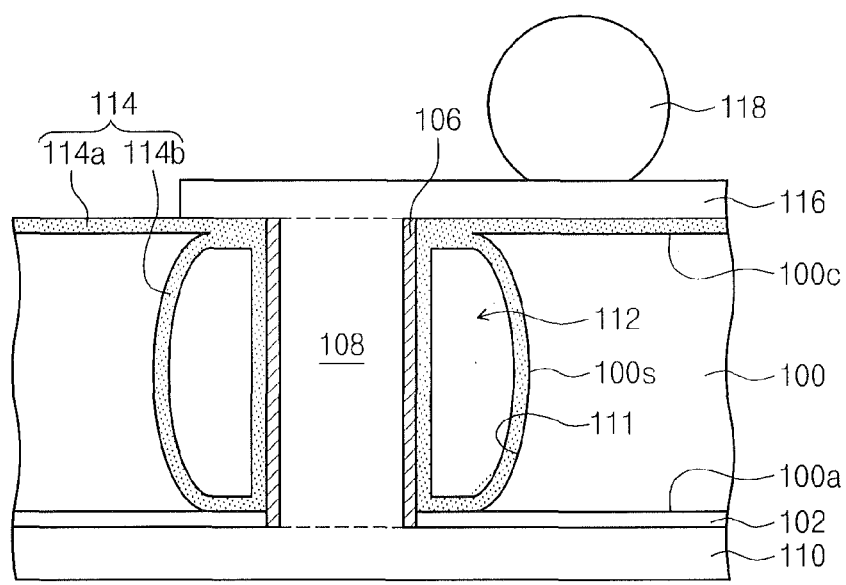

FIGS. 4A through 4C are cross-sectional views illustrating methods of fabricating a semiconductor device according to still other example embodiments of the inventive concepts.

Referring to FIG. 4A, the substrate 100 may be selectively etched using the process described with reference to FIGS. 2A through 2F or modifications thereof to form the trench 111 around the through electrode 108. For instance, the formation of the trench 111 may include forming a mask 92 on the inactive surface 100c of the substrate 100 and then etching the substrate 100 in an isotropic dry etching manner using the mask 92 as an etch-mask. In some embodiments, a portion of the substrate 100 covered with the mask 92 may be under-cut to have a curved surface. For instance, from a vertical view, the inner surface 100s of the substrate 100 may be formed to have a substantially concave shape. In other words, a horizontal width W2 of the trench 111 may vary (e.g., repeatedly increase and decrease) depending on a depth of the trench 111. In some embodiments, the width W2 of the trench 111 may have a maximum value at or near a center of the sidewall 100s of the trench 111 and may have a minimum value at the top and/or bottom entrances of the trench 111.

Referring to FIG. 4B, the lower insulating layer 114 may be formed to extend along or cover the inactive surface 100c of the substrate 100 and the protruding portion 108b of the through electrode 108. The lower insulating layer 114 may include the external insulating portion layer 114a on or covering the inactive surface 100c and the internal insulating layer portion 114b extending into the trench 111 and hermetically sealing the entrance of the trench 111. As a result, the gap 112 confined within and surrounded by the internal insulating layer 114b may be formed in the trench 111. In the present embodiments, the gap 112 may be formed to have a substantially convex-shaped profile.

Referring to FIG. 4C, the planarization process may be performed to remove the protruding portion 108b of the through electrode 108. In some embodiments, the lower wiring 116 and/or the solder ball 118, which may be connected to the through electrode 108, may be formed. In the present embodiments, since the gap 112 has a convex profile, it is possible to further reduce the possibility of the through electrode 108 being in contact with the substrate 100.

Figure 5A:
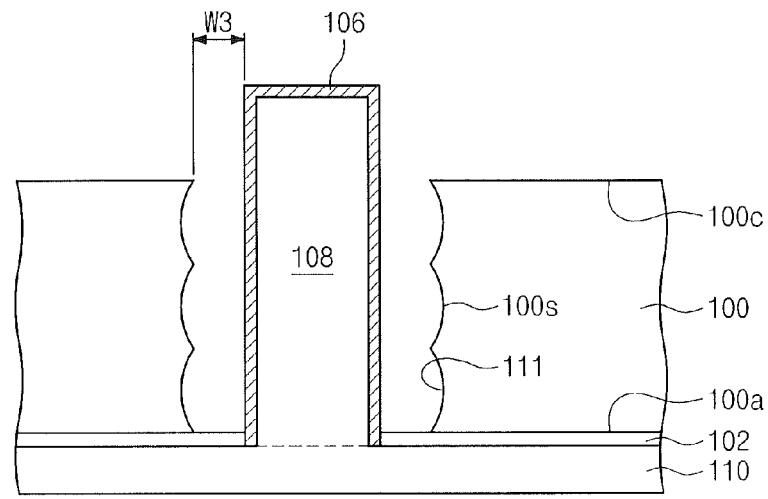
FIGS. 5A through 5C are cross-sectional views illustrating methods of fabricating a semiconductor device according to even other example embodiments of the inventive concepts.
Figure 5B:
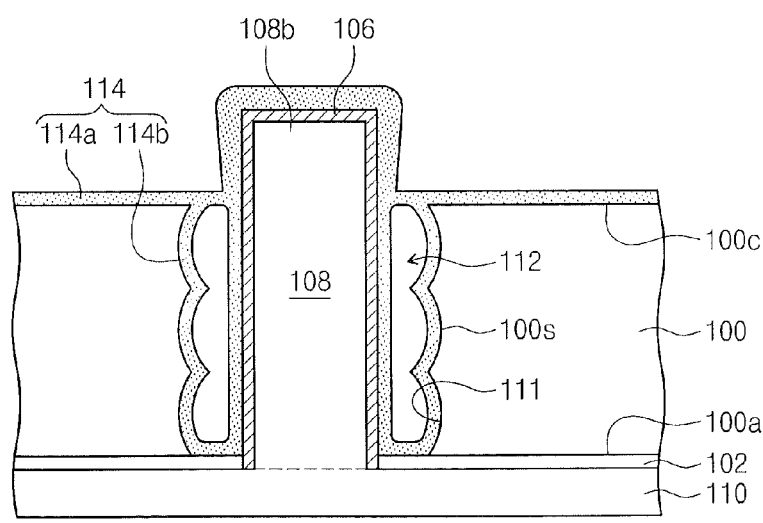
Figure 5C:
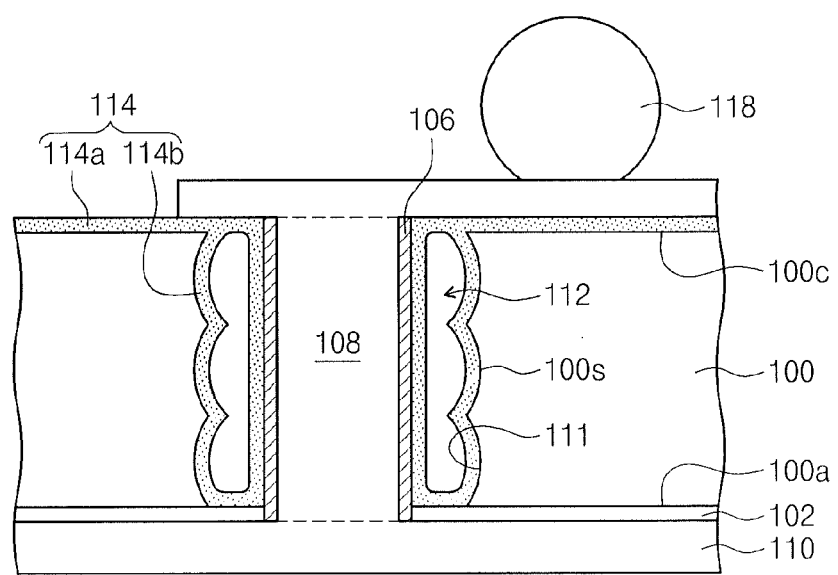

FIGS. 5A through 5C are cross-sectional views illustrating methods of fabricating a semiconductor device according to yet other example embodiments of the inventive concepts.

Referring to FIG. 5A, the substrate 100 may be selectively etched using the process described with reference to FIGS. 2A through 2F or modifications thereof to form the trench 111 around the through electrode 108. For instance, the formation of the trench 111 may include repeatedly or iteratively performing an isotropic etching step and a polymer depositing step to remove a portion of the substrate 100 adjacent to the through electrode 108. As a result, a plurality of concave portions may be formed on the inner surface 100s of the substrate 100 and the trench 111 may be formed to have scallop shaped sidewalls. A width W3 of the trench 111 may vary (e.g., repeatedly increase and decrease) depending on a depth of the trench 111. As the number of iterations of the isotropic etching step and the polymer depositing step increases, the inner surface 100s of the substrate 100 may be transformed from the scalloped shape to a substantially linear shape. In this sense, the trench 111 may be formed to have a substantially vertical sidewall using an isotropic etch process, similar to the case of using an anisotropic etching process.

Referring to FIG. 5B, the lower insulating layer 114 may be formed to extend along or cover the inactive surface 100c of the substrate 100 and the protruding portion 108b of the through electrode 108. The lower insulating layer 114 may include the external insulating layer 114a on or covering the inactive surface 100c of the substrate 100 and the internal insulating layer 114b extending into the trench 111. Furthermore, the gap 112 defined by the internal insulating layer 114b may be formed to have a scallop-shaped profile in the trench 111.

Referring to FIG. 5C, the planarization process may be performed to remove the protruding portion 108b of the through electrode 108, and furthermore, the lower wiring 116 and/or the solder ball 118 coupled to the through electrode 108 may be formed.

FIGS. 6A through 6F are cross-sectional views illustrating methods of fabricating a semiconductor device according to yet other example embodiments of the inventive concepts. FIG. 6G is a cross-sectional view illustrating methods of fabricating a semiconductor device according to a modification of the embodiment described with reference to FIG. 6F.

Figure 6A:
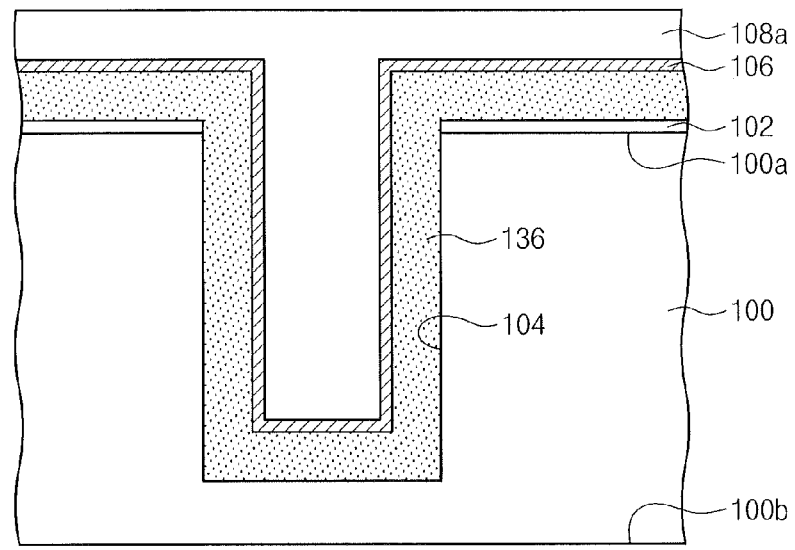
FIGS. 6A through 6F are cross-sectional views illustrating methods of fabricating a semiconductor device according to yet other example embodiments of the inventive concepts.

Referring to FIG. 6A, an etching process or a laser drilling process may be performed to form the hole or preliminary trench 104 in the substrate 100, and then a sacrificial layer 136, the liner layer 106 and a conductive layer 108a may be sequentially formed on the substrate 100. The liner layer 106 and the sacrificial layer 136 may be formed by depositing one or more of an oxide layer, a nitride layer, or a polymer layer. The opening defined by the sacrificial layer 136 and/or the liner layer 106 thereon provides a via hole in which the through electrode 108 can be formed. In some embodiments, the sacrificial layer 136 may extend from the hole 104 to the active surface 100a of the substrate 100. The upper insulating layer 102 may be interposed between the sacrificial layer 136 and the active surface 100a of the substrate 100. The liner layer 106 may be formed by depositing a material having an etch selectivity with respect to the sacrificial layer 136 and may extend along and cover the sacrificial layer 136. In some embodiments, the liner layer 106 may be formed of an oxide layer or a nitride layer, and the sacrificial layer 136 may be formed of a polymer layer. In other embodiments, the liner layer 106 may be formed of a polymer layer or a nitride layer, and the sacrificial layer 136 may be formed of an oxide layer. Alternatively, the liner layer 106 may be formed of an oxide layer and the sacrificial layer 136 may be formed of a polymer layer or a nitride layer. In still other embodiments, when the substrate 100 is formed of a single-crystalline silicon layer, the sacrificial layer 136 may be formed of a polysilicon layer and the liner layer 106 may be formed of an oxide layer or a nitride layer. The conductive layer 108a may be formed to cover the liner layer 106 by depositing or plating a conductor such as polysilicon or metal.

Figure 6B:
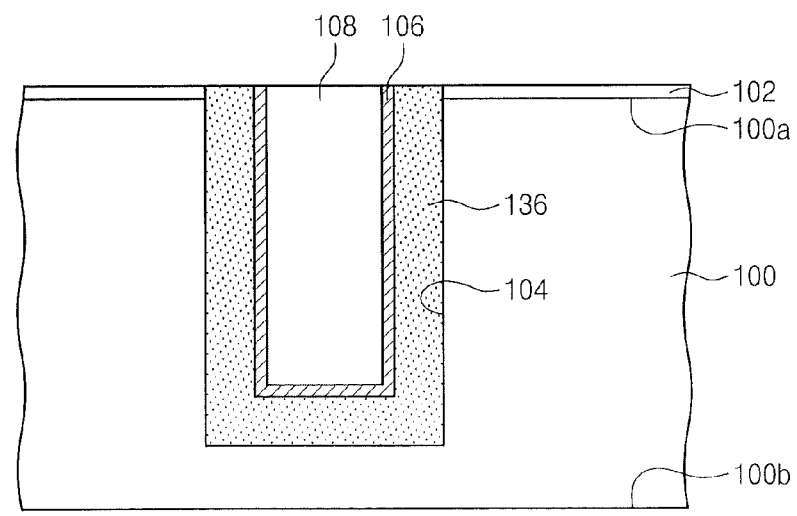

Referring to FIG. 6B, the conductive layer 108a, liner layer 106 and the sacrificial layer 136 may be planarized until the upper insulating layer 102 is exposed. Therefore, the conductive layer 108a may be restricted or confined within the hole 104 to form the through electrode 108 in the hole 104. The through electrode 108 may be formed to cover the liner layer 106 in the hole 104.

Figure 6C:
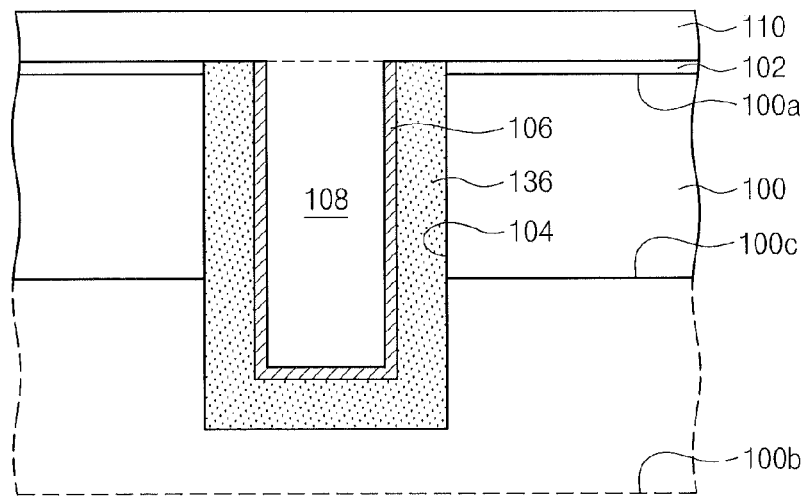

Referring to FIG. 6C, at least one of an etching process, a grinding process, a CMP process, a spin etching process or any combination thereof may be performed to recess or thin the bottom surface 100b of the substrate 100. The recessing process may be performed using an etchant capable of selectively removing a material of the substrate 100 (e.g., silicon). As the result of the recessing process, the substrate 100 may have a reduced thickness such that the inactive surface 100c exposing a portion of the through electrode 108 is formed. More particularly, the recessing process may be performed to expose a portion of the sacrificial layer 136 surrounding the through electrode 108. In addition, the upper wiring 110 may be further formed on the active surface 100a to be connected to the through electrode 108. In some embodiments, the formation of the upper wiring 110 may be skipped or omitted.

Figure 6D:
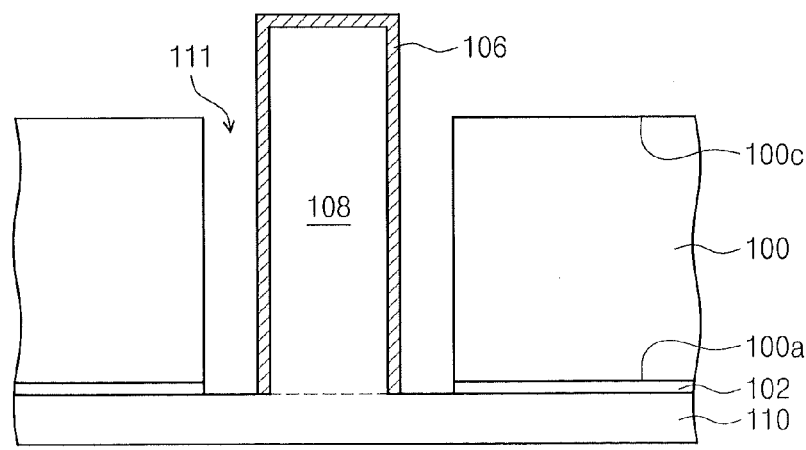

Referring to FIG. 6D, the sacrificial layer 136 may be selectively removed to form the trench 111 around the through electrode 108. In some embodiments, the removal of the sacrificial layer 136 may be performed on the inverted or rotated substrate 100. When the sacrificial layer 136 is formed of a polymer layer, the removal of the sacrificial layer 136 may be performed using an ashing technique. Alternatively, when the sacrificial layer 136 is formed of a polysilicon layer, the sacrificial layer 136 may be selectively removed using a difference in an etch rate between polysilicon and single-crystalline silicon. Generally, the etch rate of polysilicon may be greater than the etch rate of single-crystalline silicon. Therefore, the sacrificial layer 136 may be selectively etched to form the trench 111.

Figure 6E:
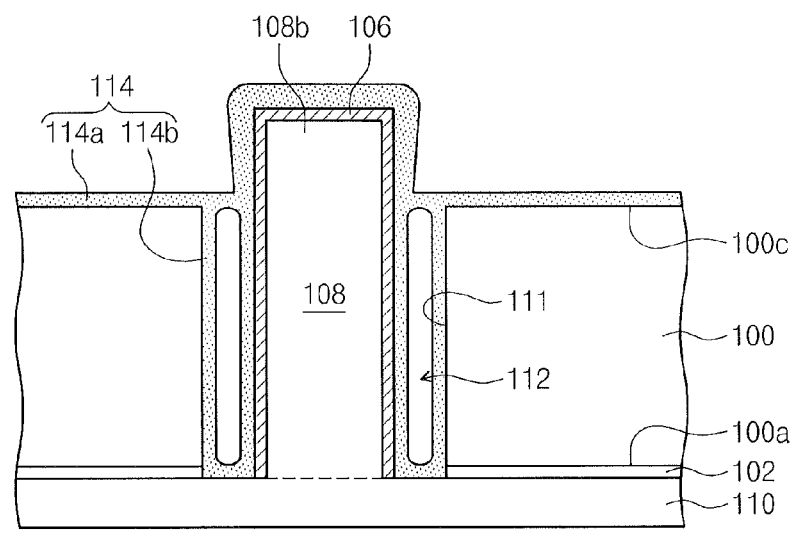

Referring to FIG. 6E, the lower insulating layer 114 may be formed to extend along or cover the inactive surface 100c of the substrate 100 and the protruding portion 108b of the through electrode 108. The lower insulating layer 114 may include the external insulating layer 114a on or covering the inactive surface 100c of the substrate 100 and the internal insulating layer 114b extending into the trench 111 and hermetically sealing the entrance of the trench 111. As a result, the gap 112 confined within and surrounded by the internal insulating layer 114b may be formed in the trench 111.

Figure 6F:
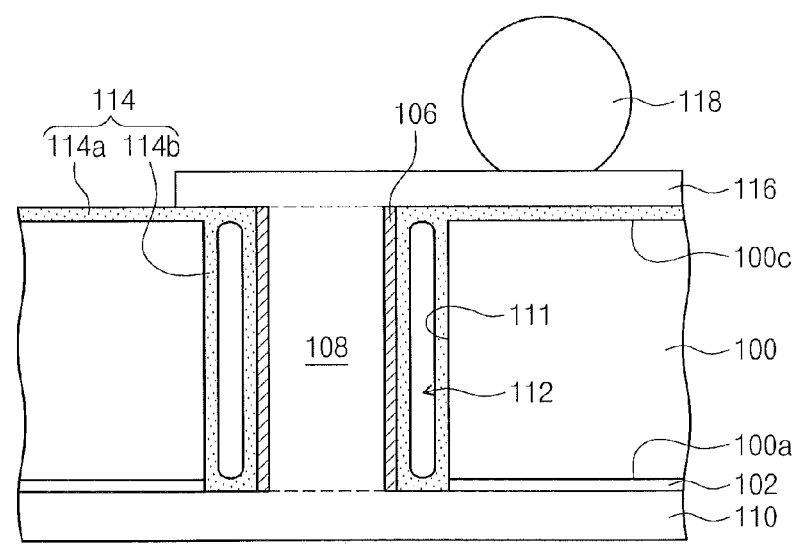
Figure 6G:
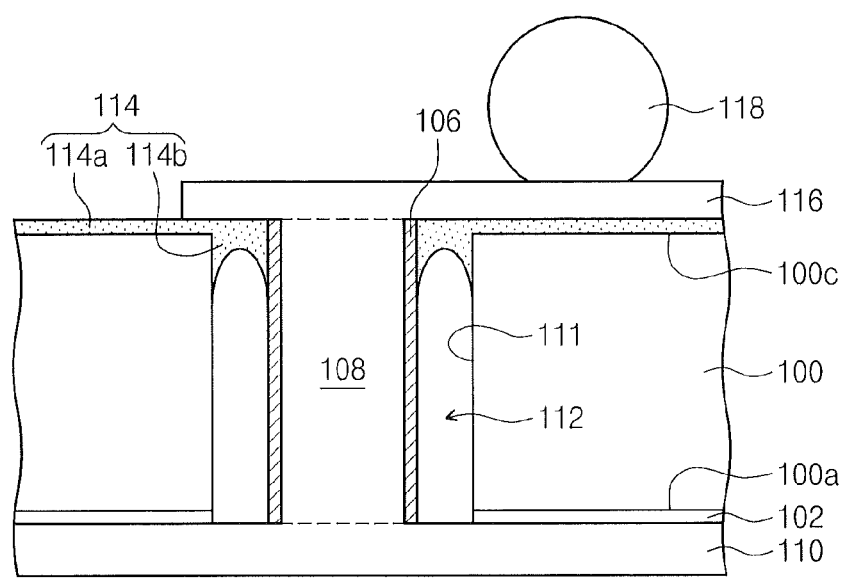
FIG. 6G is a cross-sectional view illustrating methods of fabricating a semiconductor device according to a modification of the embodiment described with reference to FIG. 6F.

Referring to FIG. 6F, the planarization process may be performed to remove the protruding portion 108b of the through electrode 108. In addition, the lower wiring 116 and/or the solder ball 118 coupled to the through electrode 108 may be formed. According to the present embodiments, since the trench 111 is formed without etching the substrate 100, it is possible to prevent the substrate 100 from being damaged by an etching process.

In some embodiments, as shown in FIG. 6G, the internal insulating layer 114b of the lower insulating layer 114 may be partially extended into the trench 111 on portions of the sidewalls thereof, while the entrance of the trench 111 may be sealed by the internal insulating layer 114b. In this case, the inner sidewalls of the trench 111 and/or the liner layer 106 may be partially exposed and may define boundaries of the gap 112.

FIGS. 7A through 7F are cross-sectional views illustrating methods of fabricating a semiconductor device according to further example embodiments of the inventive concepts. FIGS. 7G through 7I are cross-sectional views illustrating methods of fabricating a semiconductor device according to modifications of the embodiment described with reference to FIG. 7F.

Figure 7A:
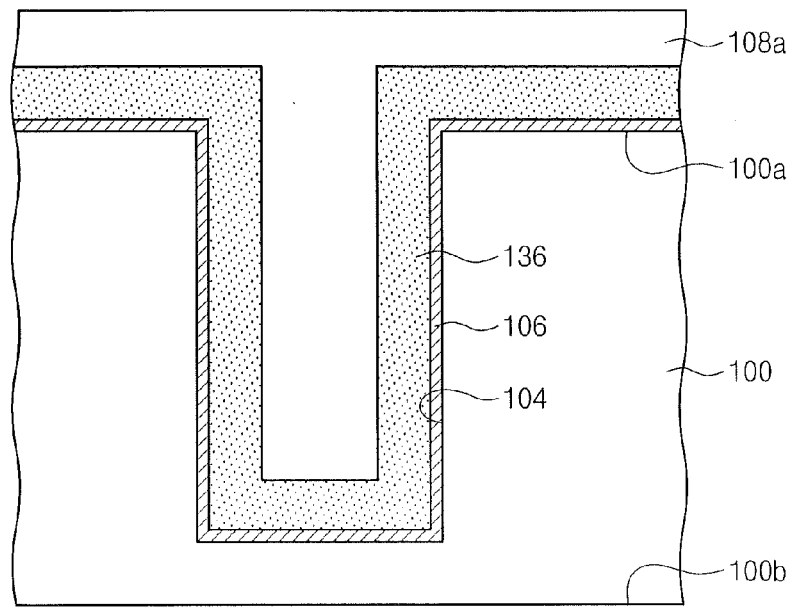
FIGS. 7A through 7F are cross-sectional views illustrating methods of fabricating a semiconductor device according to further example embodiments of the inventive concepts.

Referring to FIG. 7A, an etching process or a laser drilling process may be performed to form the hole or preliminary trench 104 in the substrate 100, and then the liner layer 106, the sacrificial layer 136 and the conductive layer 108a may be sequentially formed on the substrate 100. In some embodiments, the liner layer 106 may extend from the hole 104 to the active surface 100a of the substrate 100. The sacrificial layer 136 and/or the liner layer 106 thereon define a via hole in which the through electrode 108 is formed. The sacrificial layer 136 may be formed by depositing a material having an etch selectivity with respect to the liner layer 106 and cover the liner layer 106. In some embodiments, the liner layer 106 may be formed of an oxide layer or a nitride layer and the sacrificial layer 136 may be formed of a polymer layer. In other embodiments, the liner layer 106 may be formed of a polymer layer or a nitride layer and the sacrificial layer 136 may be formed of an oxide layer. Alternatively, the liner layer 106 may be formed of an oxide layer and the sacrificial layer 136 may be formed of a polymer layer or a nitride layer. In still other embodiments, the sacrificial layer 136 may be formed of a polysilicon layer and the liner layer 106 may be formed of an oxide layer, a nitride layer or a polymer layer. The conductive layer 108a may be formed to extend on or cover the sacrificial layer 136 by depositing or plating a conductor such as polysilicon or metal.

Figure 7B:
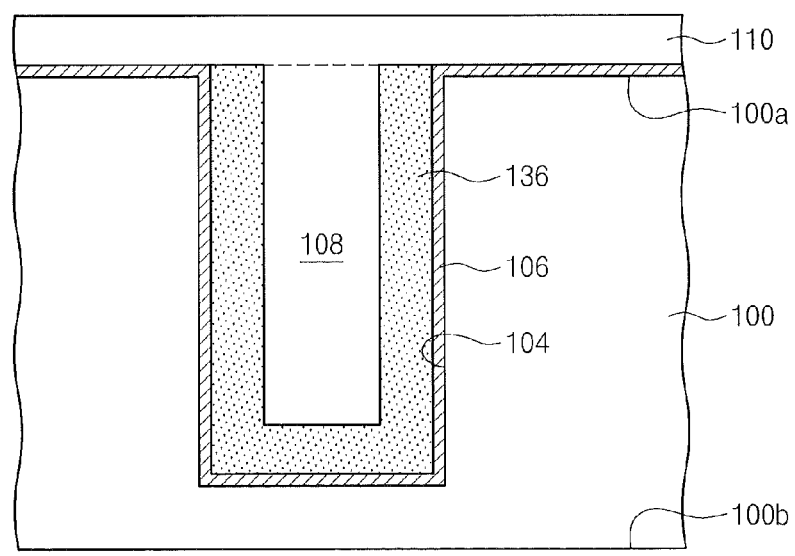

Referring to FIG. 7B, the conductive layer 108a, the sacrificial layer 136 and the liner layer 104 may be planarized such that the through electrode 108 may be formed in the hole 104. This planarization process may be performed until the liner layer 106 is exposed. The through electrode 108 may be formed to cover the sacrificial layer 136 in the hole 104. In addition, the upper wiring 110 may be further formed to be connected to the through electrode 108. In some embodiments, the formation of the upper wiring 110 may be skipped.

Figure 7C:
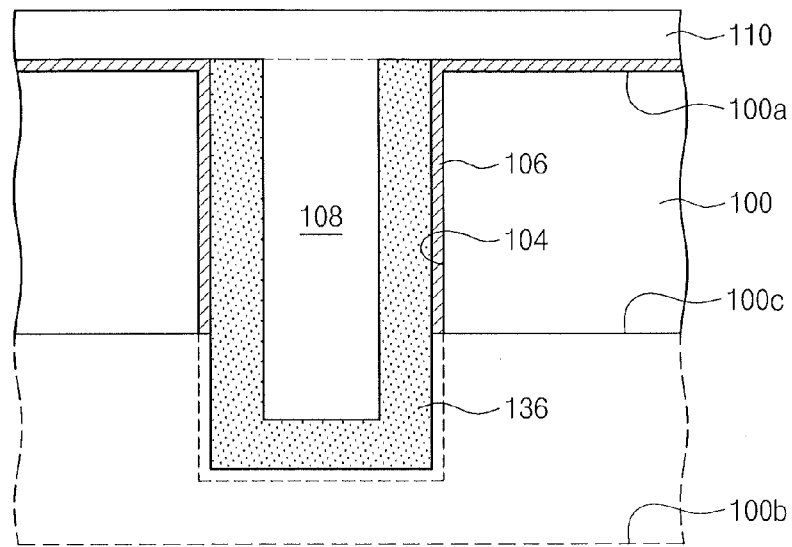

Referring to FIG. 7C, an etching process, a grinding process, a CMP process, a spin etching process or any combination thereof may be performed to recess or thin the bottom surface 100b of the substrate 100 and expose a portion of the through electrode 108. As the result of the recessing process, the substrate 100 may have a reduced thickness and the substrate 100 may have the inactive surface 100c further adjacent to the active surface 100a compared with the bottom surface 100b. Furthermore, the liner layer 106 may be exposed by the formation of the inactive surface 100c. The exposed liner layer 106 may be selectively removed.

Figure 7D:
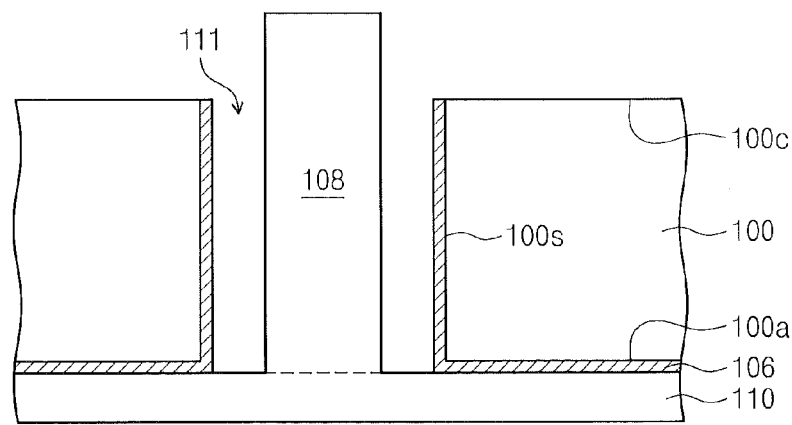

Referring to FIG. 7D, the sacrificial layer 136 may be selectively removed to form the trench 111 around the through electrode 108. In the present embodiments, the liner layer 106 may be provided on the inner surface 100s of the substrate 100.

Figure 7E:
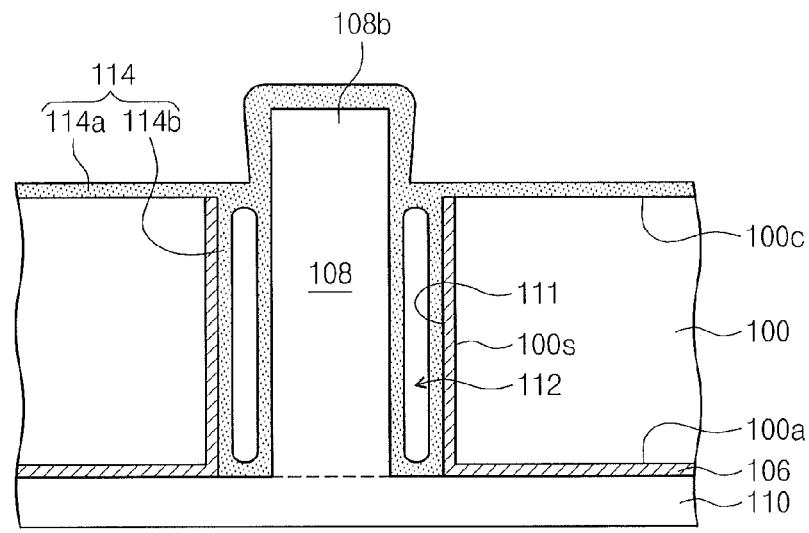

Referring to FIG. 7E, the lower insulating layer 114 may be formed to cover the inactive surface 100c of the substrate 100 and the protruding portion 108b of the through electrode 108. The lower insulating layer 114 may include the external insulating layer 114a on or covering the inactive surface 100c of the substrate 100 and the internal insulating layer 114b extending into the trench 111 and hermetically sealing the entrance of the trench 111. The gap 112 confined within the internal insulating layer 114b may thereby be formed in the trench 111.

Figure 7F:
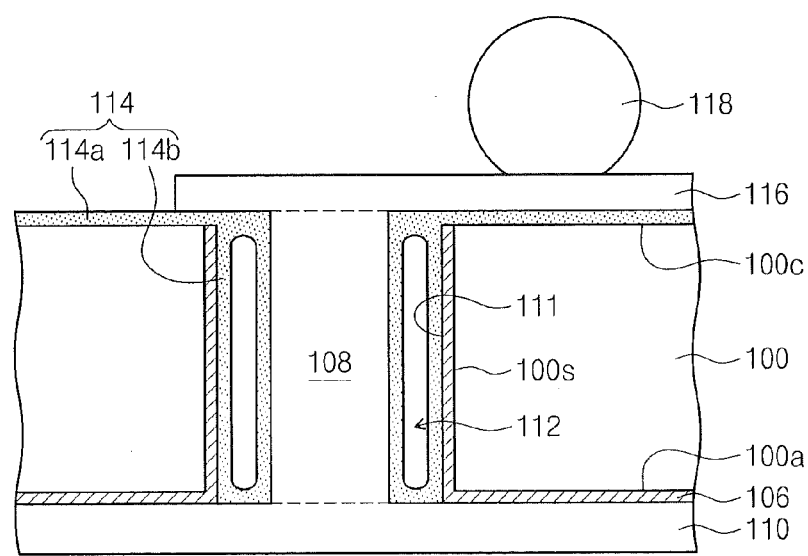
Figure 7G:
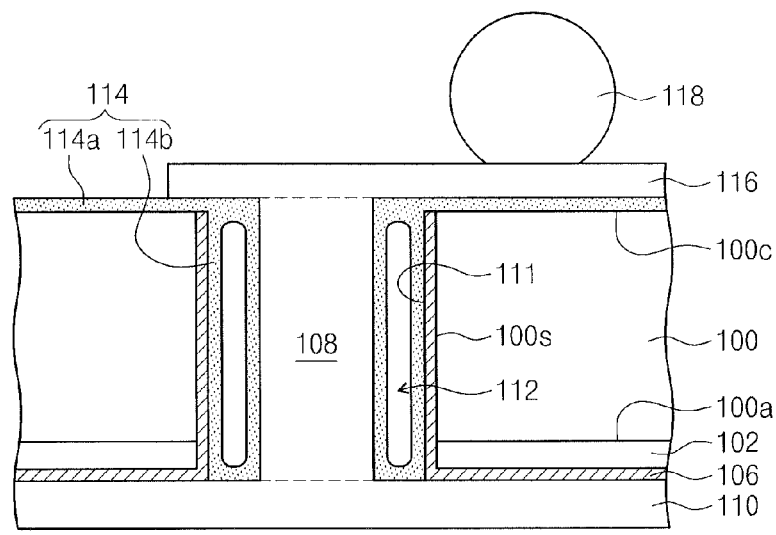
FIGS. 7G through 7I are cross-sectional views illustrating methods of fabricating a semiconductor device according to modifications of the embodiment described with reference to FIG. 7F.
Figure 7H:
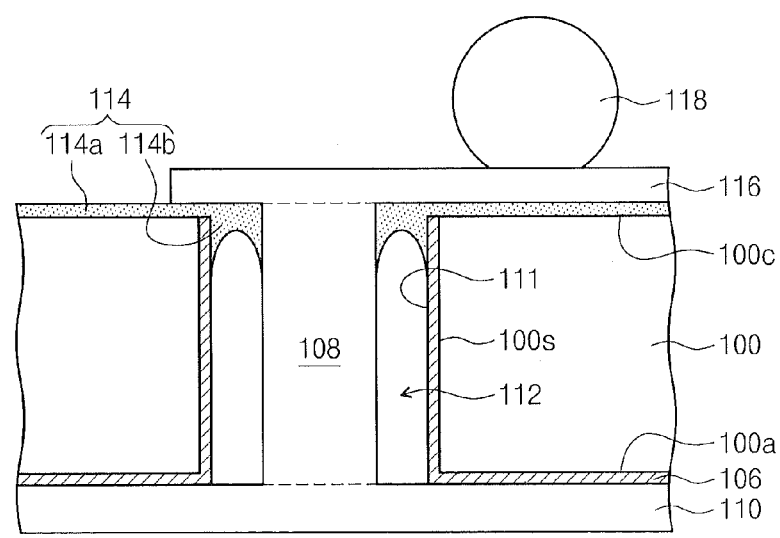
Figure 7I:
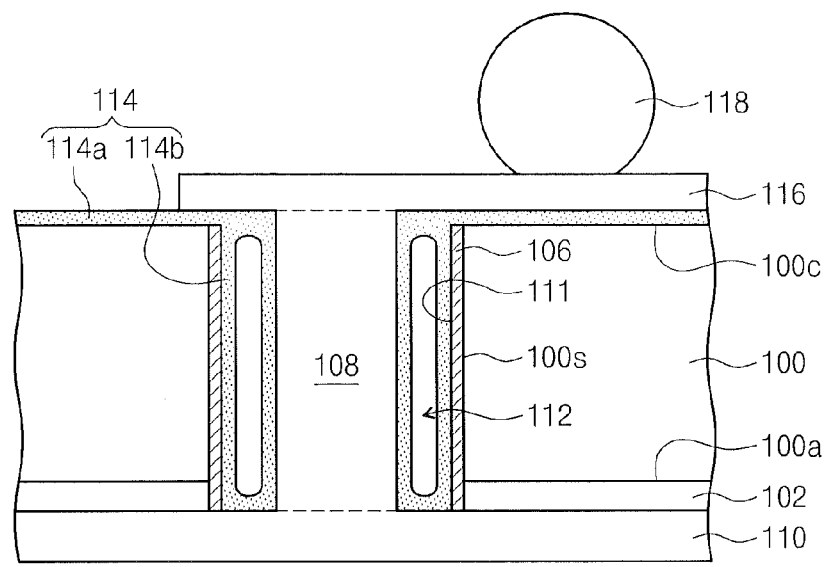

Referring to FIG. 7F, the planarization process may be performed to remove the protruding portion 108b of the through electrode 108, and then, the lower wiring 116 and/or the solder ball 118 coupled to the through electrode 108 may be optionally formed. According to the present embodiments, the liner layer 106 is formed on the inner surface 100s of the substrate 100, (e.g., on sidewalls 100s of the preliminary trench), rather than on the sidewall of the through electrode 108. Except for this difference in the position of the liner layer 106, the semiconductor device according to the present embodiments may have the substantially same structure as the aforementioned embodiments.

In some embodiments, as shown in FIG. 7G, the upper insulating layer 102 may be further formed on the active surface 100a of the substrate 100. The trench 111 may be formed to penetrate or extend through the upper insulating layer 102 as well as the substrate 100, and thus, the gap 112 may be vertically extended toward the upper wiring 110.

In some embodiments, as shown in FIG. 7H, the internal insulating layer 114b of the lower insulating layer 114 may be partially extended into the trench 111 on sidewalls thereof, while the entrance of the trench 111 may be sealed by the internal insulating layer 114b.

In some embodiments, as shown in FIG. 7I, the upper insulating layer 102 may be further formed on the active surface 100a of the substrate 100 and the liner layer 106 may be formed to have a vertical shape extending on or covering the inner surface 100s of the substrate 100. In other words, the liner layer 106 may be formed on sidewalls 100s of the trench 111 and may be confined within the trench 111, without extending onto the active surface 100a.

Figure 8A:
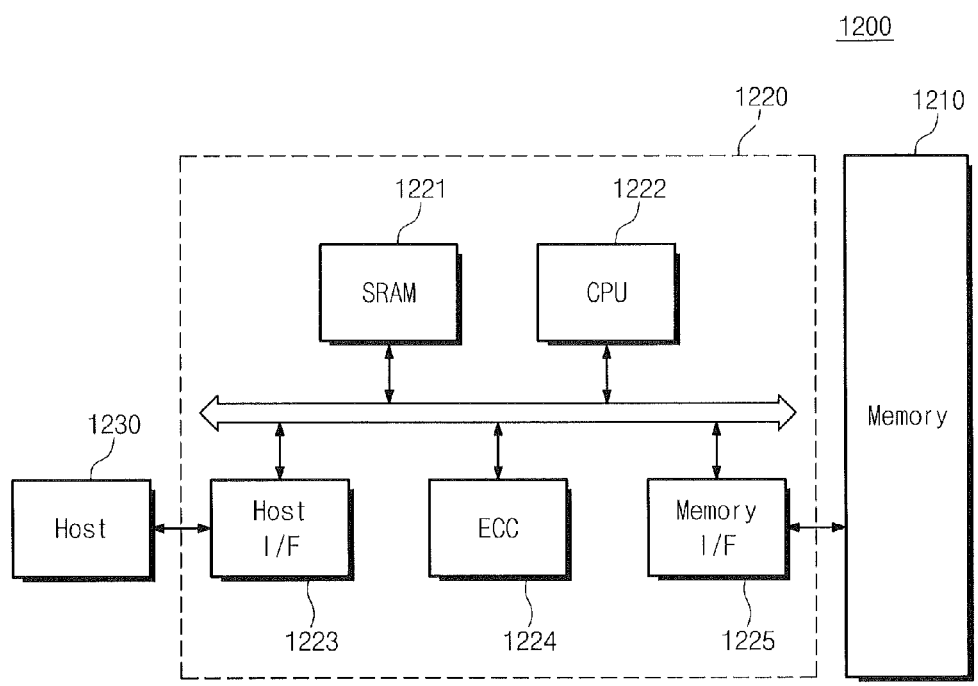
FIG. 8A is a block diagram illustrating a memory card including a semiconductor device according to example embodiments of the inventive concepts.

FIG. 8A is a block diagram illustrating a memory card including a semiconductor device according to example embodiments of the inventive concepts.

Referring to FIG. 8A, a memory card 1200 may include a memory controller 1220 controlling general data exchanges between a host and the memory device 1210. A static random access memory (SRAM) 1221 may be used as an operating memory of a processing unit 1222. A host interface 1223 may include a data exchange protocol of a host connected to a memory card 1200. An error correction block 1224 may detect and correct errors included in data read from a multi-bit memory device 1210. A memory interface 1225 may interface with the memory device 1210. A processing unit 1222 may perform general control operations for data exchange of the memory controller 1220. The memory device 1210 may include the semiconductor device 1 according to embodiments of the inventive concepts.

Figure 8B:
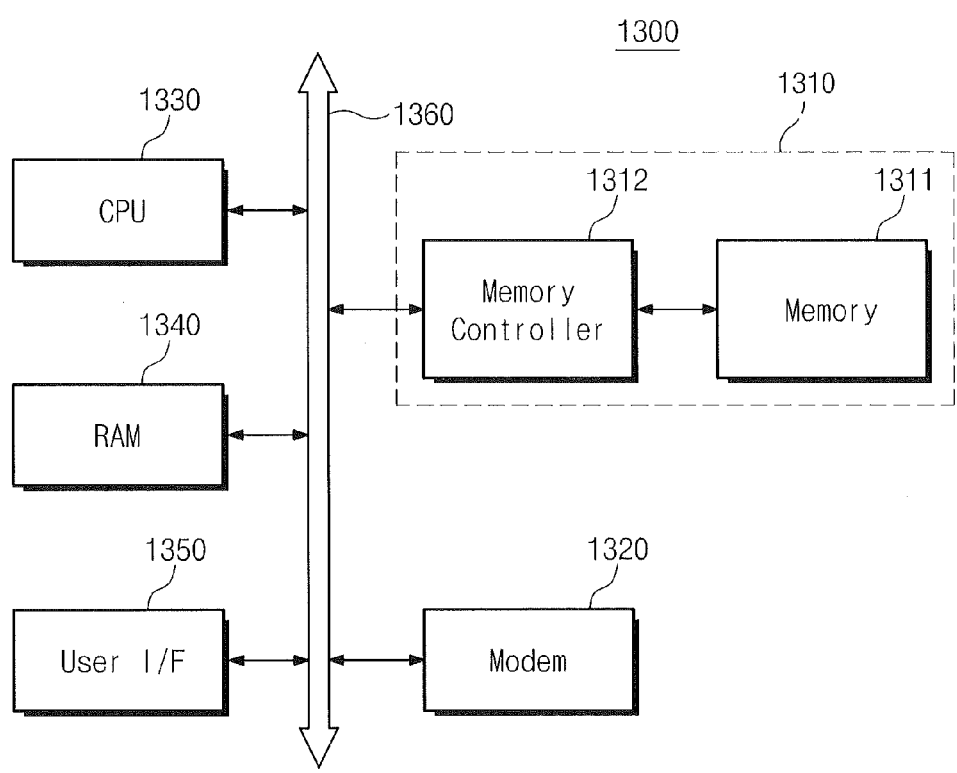
FIG. 8B is a block diagram illustrating an information processing system including a semiconductor device according to example embodiments of the inventive concepts.

FIG. 8B is a block diagram illustrating an information processing system including a semiconductor device according to example embodiments of the inventive concepts.

Referring to FIG. 8B, an information processing system 1300 may be realized using a memory system 1310 including at least one of the semiconductor device 1 according to example embodiments of the inventive concepts. For instance, the information processing system 1300 may be a mobile device and/or a desktop computer. In some embodiments, the information processing system 1300 may further include a modem 1320, a central processing unit (CPU) 1330, a RAM 1340, and a user interface 1350, which are electrically connected to a system bus 1360, in addition to the memory system 1310. The memory system 1310 may include a memory device 1311 and a memory controller 1312. In some embodiments, the memory system 1310 may be configured substantially identical to the memory system described with respect to FIG. 8A. Data processed by the CPU 1330 and/or input from the outside may be stored in the memory system 1310. In some embodiments, the memory system 1310 may be used as a portion of a solid state drive (SSD), and in this case, the information processing system 1300 may stably and reliably store a large amount of data in the memory system 1310. Although not illustrated, it will be apparent to those skilled in the art that, for example, an application chipset, a camera image sensor, a camera image signal processor (ISP), an input/output device, or the like may further be included in the information processing system 1300 according to the inventive concepts.

According to embodiments of the inventive concepts, a gap region, which can be in a vacuum state or filled with air, may be provided between the through electrode and the substrate. That is, a dielectric constant of the gap region is close to about 1. This makes it possible to improve electrically insulating properties between the through electrode and the substrate. Furthermore, a liner layer may be provided to cover a sidewall of the through electrode, which may be exposed by the gap region. The liner layer makes it possible to reduce problems associated with expansion or distortion of the through electrode, which may result in an electrical short between the through electrode and the substrate. In addition, a lower insulating layer extending along or coated on a bottom surface of the substrate outside of a trench therein may be extended between the through electrode and the substrate. The lower insulating layer makes it possible to reduce or prevent electrical contact between the through electrode and the substrate and relieve stress therebetween. As a result, the semiconductor device can exhibit improved properties in terms of structural and electrical properties.

While example embodiments of the inventive concepts have been particularly shown and described, it will be understood by one of ordinary skill in the art that variations in form and detail may be made therein without departing from the spirit and scope of the attached claims.

What is claimed is:

1. A microelectronic device, comprising:
   a substrate including a trench extending therethrough between an active surface thereof and an inactive surface thereof opposite the active surface, the inactive surface having at least one external connecting element thereon;
   a conductive via electrode extending through the substrate between sidewalls of the trench and spaced apart therefrom;
   an insulating liner layer between the sidewalls of the trench and sidewalls of the via electrode; and
   an insulating layer comprising an external portion extending along the inactive surface outside the trench and an internal portion extending at least partially into the trench on the sidewalls thereof and on the sidewalls of the via electrode, wherein the internal portion of the insulating layer seals an entrance of the trench to define an enclosed gap region separating the via electrode from the substrate by a distance greater than a thickness of the insulating liner layer,
   wherein the sidewalls of the trench and the insulating liner layer are partially exposed to the gap region such that the exposed sidewalls of the trench and the exposed insulating liner layer define boundaries of the gap region.

2. The device of claim 1, wherein the gap region comprises an elongated void extending along the sidewalls of the via electrode, and wherein the gap region is confined within the trench by the insulating layer.

3. The device of claim 2, wherein the insulating liner layer extends along the sidewalls of the via electrode between the via electrode and the insulating layer.

4. The device of claim 3, wherein the insulating layer extends on upper portions of the sidewalls of the trench, wherein lower portions of the sidewalls of the trench are free of the insulating layer, and wherein the insulating layer, the insulating liner layer, and the sidewalls of the trench define respective boundaries of the gap region.

5. The device of claim 2, wherein the insulating layer extends along the sidewalls of the trench and the sidewalls of the via electrode, and wherein the gap region comprises a cavity confined within the insulating layer that surrounds the via electrode.

6. The device of claim 2, wherein the insulating layer comprises:
   a second insulating layer extending along the sidewalls of the trench and the sidewalls of the via electrode; and
   a first insulating layer extending along the inactive surface of the substrate outside the trench and extending at least partially into the trench to hermetically seal the gap region.

7. The device of claim 2, wherein the gap region comprises a vacuum region or is filled with a gaseous material, and wherein the gap region has a dielectric constant of about 1.

8. The device of claim 2, further comprising:
   at least one microelectronic component on the active surface of the substrate; and
   one or more interlayer insulating layers on the active surface of the substrate including the at least one microelectronic component thereon.

9. The device of claim 8, wherein the gap region extends beyond the active surface of the substrate and into at least one of the one or more interlayer insulating layers.

10. The device of claim 8, wherein the gap region is confined between the active and inactive surfaces of the substrate.

11. The device of claim 2, wherein the insulating liner layer extends along the sidewalls of the trench between the substrate and the insulating layer.

12. The device of claim 1, wherein the sidewalls of the trench are concave.

13. The device of claim 1, wherein the distance by which the gap region separates the via electrode from the substrate is equal to about twice the thickness of the insulating layer.

14. The device of claim 13, wherein the distance by which the gap region separates the via electrode from the substrate is of about 4 micrometers or less.

15. The device of claim 14, wherein the distance by which the gap region separates the via electrode from the substrate is about 500 nanometers or more.

16. A microelectronic device, comprising:
   a substrate including a trench extending therethrough;
   a via electrode extending through the substrate between sidewalls of the trench and spaced apart therefrom;
   an insulating liner layer between the sidewalls of the trench and sidewalls of the via electrode; and an insulating layer comprising an external portion extending along an inactive surface of the substrate having an external connecting element thereon and an internal portion extending at least partially into the trench on the sidewalls thereof and on the sidewalls of the via electrode, wherein the internal portion of the insulating layer seals an entrance of the trench to define an enclosed gap region comprising an unobstructed space that separates the via electrode from the substrate by a distance greater than a thickness of the insulating liner layer, wherein the sidewalls of the trench and the insulating liner layer partially exposed to the gap region such that the exposed sidewalls of the trench and the exposed insulating liner layer define boundaries of the gap region.

17. The device of claim 16, wherein the gap region comprises an elongated void having a dielectric constant of about 1 extending along the sidewalls of the via electrode, and wherein the gap region is confined within the trench by the insulating layer.

18. The device of claim 17, wherein the inactive surface of the substrate is opposite an active surface of the substrate including at least one microelectronic component thereon, and further comprising:

one or more interlayer insulating layers on the active surface of the substrate.

19. The device of claim 18, further comprising:

at least one wiring layer on the active surface or the inactive surface and electrically connected to the via electrode, wherein the gap region is confined below the at least one wiring layer.

20. A microelectronic device, comprising:

a substrate including a trench extending therethrough between an active surface thereof and an inactive surface thereof opposite the active surface;

at least one microelectronic component on the active surface;

at least one connecting element on the inactive surface, wherein the at least one connecting element is configured to connect the microelectronic device to an external device;

a conductive via electrode extending through the substrate between sidewalls of the trench and spaced apart therefrom, the via electrode providing an electrical connection between the at least one connecting element and the active surface;

an insulating liner layer between the sidewalls of the trench and sidewalls of the via electrode; and an insulating layer comprising an external portion extending along the inactive surface outside the trench and an internal portion extending into the trench on the sidewalls thereof and on the sidewalls of the via electrode, wherein the internal portion of the insulating layer seals an entrance of the trench to define an enclosed gap region comprising an elongated unobstructed space extending along the sidewalls of the via electrode and separating the via electrode from the substrate by a distance greater than a thickness of the insulating layer, wherein the enclosed gap region is confined within the insulating layer and comprises a vacuum region or gaseous material having a dielectric constant of about 1.

* * * * *